(12) United States Patent
Park et al.

(10) Patent No.: US 11,784,213 B2
(45) Date of Patent: Oct. 10, 2023

(54) INTEGRATED CIRCUIT DEVICE

(71) Applicant: SAMSUNG ELECTRONICS CO., LTD., Suwon-si (KR)

(72) Inventors: Jungmin Park, Seoul (KR); Hanjin Lim, Seoul (KR); Haeryong Kim, Seongnam-si (KR); Younglim Park, Anyang-si (KR); Cheoljin Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 143 days.

(21) Appl. No.: 17/315,947

(22) Filed: May 10, 2021

(65) Prior Publication Data

US 2022/0115496 A1     Apr. 14, 2022

(30) Foreign Application Priority Data

Oct. 12, 2020   (KR) .................. 10-2020-0131293

(51) Int. Cl.
  H01L 49/02     (2006.01)
(52) U.S. Cl.
  CPC ................... H01L 28/60 (2013.01)
(58) Field of Classification Search
  CPC .... H01L 28/56; H01L 28/75; H01L 21/02186
  See application file for complete search history.

(56) References Cited

U.S. PATENT DOCUMENTS

| | | | |
|---|---|---|---|
| 7,735,206 B2 | 6/2010 | Park | |
| 8,486,780 B2 | 7/2013 | Rui et al. | |
| 9,978,753 B2 | 5/2018 | Ahn et al. | |
| 2009/0273882 A1 | 11/2009 | Park et al. | |
| 2017/0200782 A1 | 7/2017 | Lee et al. | |
| 2020/0091279 A1 | 3/2020 | Moon et al. | |
| 2021/0142946 A1* | 5/2021 | Kang | ............... H01L 27/10805 |

FOREIGN PATENT DOCUMENTS

| | | | | |
|---|---|---|---|---|
| EP | 2434529 | * | 3/2012 | ............. H01L 21/02 |
| KR | 10-2013-0123183 A | | 11/2013 | |

* cited by examiner

*Primary Examiner* — John A Bodnar
(74) *Attorney, Agent, or Firm* — Lee IP Law, P.C.

(57) ABSTRACT

An integrated circuit device including a first electrode layer including a first metal and having a first thermal expansion coefficient; a dielectric layer on the first electrode layer, the dielectric layer including a second metal oxide including a second metal that is different from the first metal, and having a second thermal expansion coefficient that is less than the first thermal expansion coefficient; and a first stress buffer layer between the first electrode layer and the dielectric layer, the first stress buffer layer including a first metal oxide including the first metal, and being formed due to thermal stress of the first electrode layer and thermal stress of the dielectric layer.

19 Claims, 35 Drawing Sheets

INTEGRATED CIRCUIT DEVICE

CROSS-REFERENCE TO RELATED APPLICATION

Korean Patent Application No. 10-2020-0131293, filed on Oct. 12, 2020 in the Korean Intellectual Property Office, and entitled: "Integrated Circuit Device," is incorporated by reference herein in its entirety.

BACKGROUND

1. Field

Embodiments relate to an integrated circuit device.

2. Description of the Related Art

An integrated circuit device may include a dielectric layer. As integrated circuit devices become highly integrated, the characteristics of dielectric layers are becoming very important.

SUMMARY

The embodiments may be realized by providing an integrated circuit device including a first electrode layer including a first metal and having a first thermal expansion coefficient; a dielectric layer on the first electrode layer, the dielectric layer including a second metal oxide including a second metal that is different from the first metal, and having a second thermal expansion coefficient that is less than the first thermal expansion coefficient; and a first stress buffer layer between the first electrode layer and the dielectric layer, the first stress buffer layer including a first metal oxide including the first metal, and being formed due to thermal stress of the first electrode layer and thermal stress of the dielectric layer.

The embodiments may be realized by providing an integrated circuit device including a first electrode layer including a first metal and having a first thermal expansion coefficient; a dielectric layer on the first electrode layer, the dielectric layer including a second metal oxide including a second metal that is different from the first metal, and having a second thermal expansion coefficient that is less than the first thermal expansion coefficient; a first stress buffer layer between the first electrode layer and the dielectric layer, the first stress buffer layer including a first metal oxide including the first metal, and being formed due to thermal stress of the first electrode layer and thermal stress of the dielectric layer; and a second stress buffer layer between the first electrode layer and the first stress buffer layer, the second stress buffer layer including a third metal oxide including a third metal that is different from the second metal.

The embodiments may be realized by providing an integrated circuit device including a lower electrode layer including a first metal and having a first thermal expansion coefficient; an upper electrode layer above the lower electrode layer and facing the lower electrode layer; and a dielectric structure between the lower electrode layer and the upper electrode layer, wherein the dielectric structure includes a dielectric layer on the lower electrode layer, the dielectric layer including a second metal oxide including a second metal that is different from the first metal, and having a second thermal expansion coefficient that is less than the first thermal expansion coefficient; and a first stress buffer layer between the lower electrode layer and the dielectric layer, the first stress buffer layer including a first metal oxide including the first metal, and being formed due to thermal stress of the lower electrode layer and thermal stress of the dielectric layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
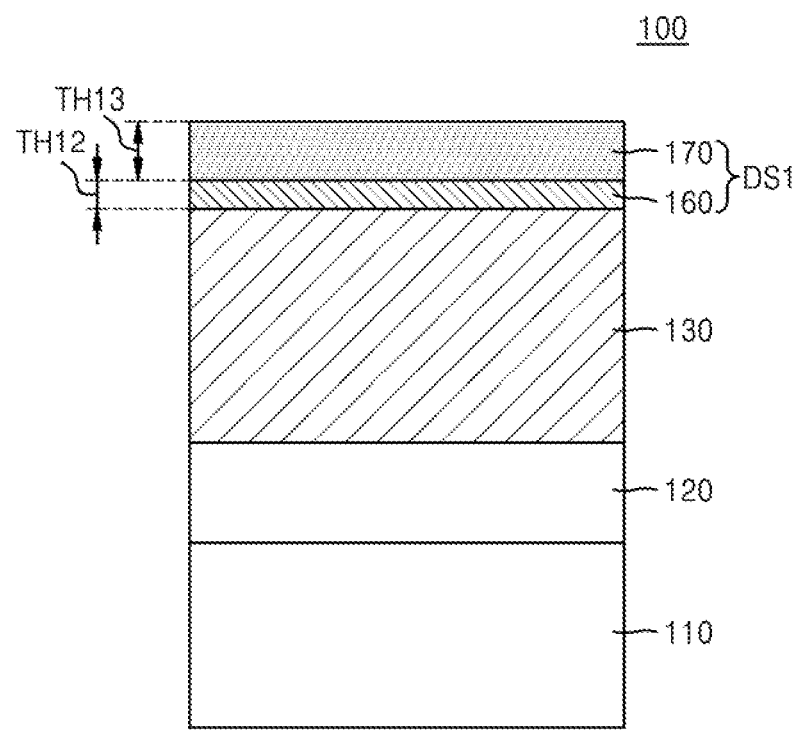
FIG. 1 is a cross-sectional view of a main configuration of an integrated circuit device according to an embodiment.

FIG. 1 is a cross-sectional view of a main configuration of an integrated circuit device according to an embodiment.

An integrated circuit device 100 may include a substrate 110, a lower structure 120 on the substrate 110, a first electrode layer 130 on the lower structure 120, and a dielectric structure DS1 on the first electrode layer 130. The dielectric structure DS1 may include a first stress buffer layer 160 and a dielectric layer 170.

The substrate 110 may include a semiconductor element, e.g., Si or Ge, or a compound semiconductor material, e.g., SiC, GaAs, InAs, or InP. The substrate 110 may include a semiconductor substrate and at least one insulation layer on the semiconductor substrate or structures including at least one conductive region. The conductive region may include a well doped with impurities or a structure doped with impurities. In an implementation, the substrate 110 may have various device isolation structures, e.g., a shallow trench isolation (STI) structure. As used herein, the term "or" is not an exclusive term, e.g., "A or B" would include A, B, or A and B.

In an implementation, the lower structure 120 may include an insulation layer. In an implementation, the lower structure 120 may include various conductive regions, e.g., a wiring layer, a contact plug, or a transistor, and insulation layers that insulate the conductive regions from one another.

The first electrode layer 130 may include a first metal and may have a first thermal expansion coefficient. The first thermal expansion coefficient of the first electrode layer 130 may be, e.g., $8.0 \times 10^{-6}$/K or greater. In an implementation, the first thermal expansion coefficient of the first electrode layer 130 may be about $9.0 \times 10^{-6}$/K. In an implementation, a thickness (e.g., in a direction orthogonal to a surface of the substrate 110) of the first electrode layer 130 may be, e.g., 100 Å or greater.

The first electrode layer 130 may include a metal film formed of the first metal, a metal nitride film including the first metal, or a combination thereof. The first metal may be a metal capable of forming a metal oxide having a rutile crystal structure as described later.

In an implementation, the first metal may be a transition metal or a post-transition metal. In an implementation, the first metal may be, e.g., Ti, Cr, Nb, Ni, Ge, Sn, Ge, Ir, Mo, Os, Pb, Ru, Sn, Ta, or W. In an implementation, the first electrode layer 130 may include Ti, Ti nitride, Cr, Cr nitride, Nb, Nb nitride, or a combination thereof. In an implementation, the first electrode layer 130 may include TiN, CrN, NbN, or a combination thereof.

As described above, the dielectric structure DS1 including the first stress buffer layer 160 and the dielectric layer 170 may be on the first electrode layer 130. The first stress buffer layer 160 may help reduce lattice mismatch of crystal lattices at the interface between the first electrode layer 130 and the dielectric layer 170.

In the integrated circuit device 100, due to the first stress buffer layer 160, characteristics of a dielectric layer may be improved and the possibility of occurrence of a leakage current may be reduced. The dielectric structure DS1 will be described below in more detail.

The dielectric layer 170 may be on the first electrode layer 130. The dielectric layer 170 may include a second metal oxide including a second metal that is different from the above-described first metal. The dielectric layer 170 may have a second thermal expansion coefficient that is less than the first thermal expansion coefficient of the first electrode layer 130.

In an implementation, the second thermal expansion coefficient of the dielectric layer 170 may be, e.g., $5.0 \times 10^{-6}$/K or less. In an implementation, the second thermal expansion coefficient of the dielectric layer 170 may be about $4.0 \times 10^{-6}$/K. In an implementation, a difference between the first thermal expansion coefficient of the first electrode layer 130 and the second thermal expansion coefficient of the dielectric layer 170 may be from about $3.0 \times 10^{-6}$/K to about $8.0 \times 10^{-6}$/K.

The second metal of the dielectric layer 170 may be a metal that is different from the first metal included in the first electrode layer 130. In an implementation, the second metal may be Hf or Zr. In an implementation, the second metal oxide constituting the dielectric layer 170 may include hafnium oxide ($HfO_2$) or zirconium oxide ($ZrO_2$). In an implementation, a thickness TH13 (e.g., in the direction orthogonal to a surface of the substrate 110) of the dielectric layer 170 may be about 10 Å to about 100 Å.

In an implementation, the second metal oxide constituting the dielectric layer 170 may be a crystalline layer. In an implementation, the second metal oxide constituting the dielectric layer 170 may be a crystalline metal oxide. The second metal oxide constituting the dielectric layer 170 may have a tetragonal crystal structure.

The first stress buffer layer 160 may be between the first electrode layer 130 and the dielectric layer 170. The first stress buffer layer 160 may be an interposed layer between the first electrode layer 130 and the dielectric layer 170. The first stress buffer layer 160 may be an interface layer formed at the interface between the first electrode layer 130 and the dielectric layer 170.

The first stress buffer layer 160 may be formed by thermal stress of the first electrode layer 130 and thermal stress of the dielectric layer 170 as described below. The first stress buffer layer 160 may be formed by thermal stress due to a difference between the first thermal expansion coefficient of the first electrode layer 130 and the second thermal expansion coefficient of the dielectric layer 170 as described below. In an implementation, the first stress buffer layer 160 may include a first metal oxide including a first metal.

In an implementation, the first stress buffer layer 160 may have a rutile-shaped tetragonal crystal structure. In an implementation, the first metal may be Ti, Cr, Nb, Ni, Ge, Sn, Ge, Ir, Mo, Os, Pb, Ru, Sn, Ta, or W. In an implementation, the first metal oxide constituting the first stress buffer layer 160 may include Ti oxide, Cr oxide, Nb oxide, Ru oxide, Ni oxide, or the like.

The first metal oxide constituting the first stress buffer layer 160 may be a crystalline layer. In an implementation, the first metal oxide constituting the first stress buffer layer 160 may be a crystalline metal oxide. In an implementation, a thickness TH12 (e.g., in the direction orthogonal to a surface of the substrate 110) of the first stress buffer layer 160 may be about 10 Å to about 20 Å. In an implementation, the thickness TH12 of the first stress buffer layer 160 may be less than the thickness TH13 of the dielectric layer 170.

In an implementation, a lattice mismatch between the first metal oxide constituting the first stress buffer layer 160 and the second metal oxide constituting the dielectric layer 170 may be within or less than 7%. In an implementation, the first stress buffer layer 160 may include a rutile $TiO_2$ film, and even when the first stress buffer layer 160 has a relatively small thickness of about 10 Å, the first stress buffer layer 160 may have a relatively high dielectric constant of about 80 to about 130.

In an implementation, the first electrode layer 130 may include titanium nitride (TiN), the first stress buffer layer 160 may include $TiO_2$ having a rutile structure, and the dielectric layer 170 may include $HfO_2$ or $ZrO_2$ having a tetragonal crystal structure.

In an implementation, in the integrated circuit device 100, the first stress buffer layer 160 may be at the interface between the first electrode layer 130 and the dielectric layer 170. In an implementation, the first stress buffer layer 160 may have a rutile-shaped tetragonal crystal structure. In an implementation, the first stress buffer layer 160 may help reduce lattice mismatch of crystal lattices at the interface between the first electrode layer 130 and the dielectric layer 170.

In an implementation, in the integrated circuit device 100, the first stress buffer layer 160 may be between the first electrode layer 130 and the dielectric layer 170, thereby reducing the occurrence of a leakage current and also improving the characteristics of the dielectric layer 170.

Figure 2:
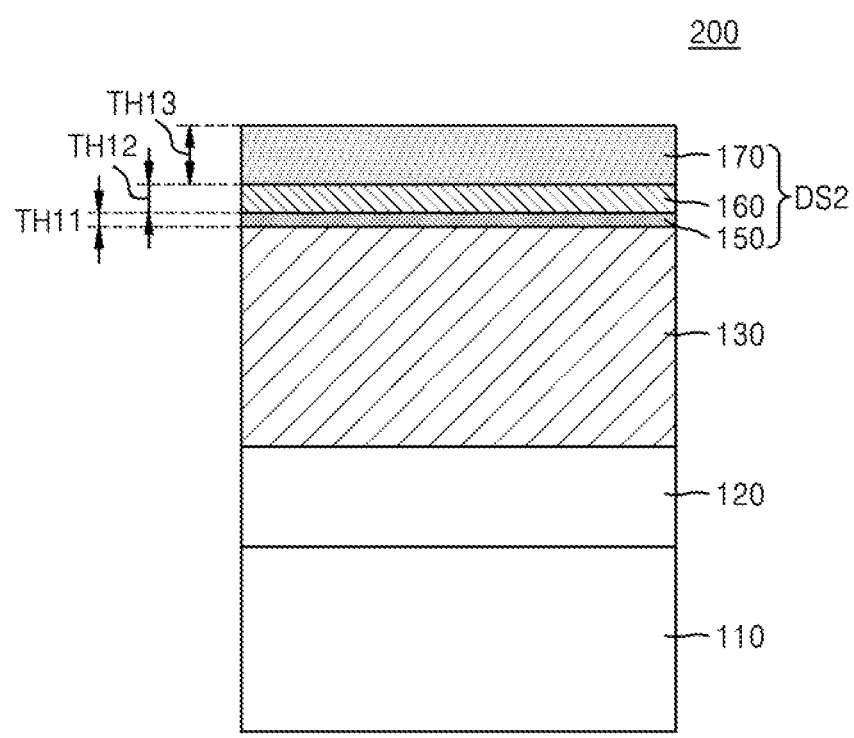
FIG. 2 is a cross-sectional view of a main configuration of an integrated circuit device according to an embodiment.

FIG. 2 is a cross-sectional view of a main configuration of an integrated circuit device according to an embodiment.

An integrated circuit device 200 may be the same as the integrated circuit device 100 of FIG. 1 except that a second stress buffer layer 150 may be included in a dielectric structure DS2. In FIG. 2, reference numerals identical to those as in FIG. 1 denote the same elements. In FIG. 2, descriptions of elements denoted by the same reference numerals as in FIG. 1 may be briefly given or omitted.

The integrated circuit device 200 may include the substrate 110, the lower structure 120 on the substrate 110, the first electrode layer 130 on the lower structure 120, and the dielectric structure DS2 on the first electrode layer 130. The dielectric structure DS2 may include the first stress buffer layer 160, the second stress buffer layer 150, and the dielectric layer 170.

The second stress buffer layer 150 may be on the first electrode layer 130. The second stress buffer layer 150 may include a third metal oxide including a third metal that is different from the second metal of the dielectric layer 170. The second stress buffer layer 150 may be an interface layer at the interface between the first electrode layer 130 and the first stress buffer layer 160. The second stress buffer layer 150 may include a material different from that constituting the first stress buffer layer 160.

The second stress buffer layer 150 may have a rutile-shaped tetragonal crystal structure that is identical to that of the first stress buffer layer 160. The second stress buffer layer 150 may be formed by thermal stress of the first electrode layer 130 and thermal stress of the dielectric layer 170.

The third metal of the second stress buffer layer 150 may be a transition metal or a post-transition metal. In an implementation, the third metal may be Ti, Cr, Nb, Ni, Ge, Sn, Ge, Ir, Mo, Os, Pb, Ru, Sn, Ta, or W. In an implementation, the third metal oxide constituting the second stress buffer layer 150 may include Ti oxide, Cr oxide, Nb oxide, Ru oxide, Ni oxide, etc.

The third metal oxide constituting the second stress buffer layer 150 may be a crystalline layer. In an implementation, the third metal oxide constituting the second stress buffer layer 150 may be a crystalline metal oxide. In an implementation, a thickness TH11 of the second stress buffer layer 150 may be 10 Å or less. The thickness TH11 of the second stress buffer layer 150 may be less than the thickness TH12 of the first stress buffer layer 160.

In an implementation, in the integrated circuit device 200, the first stress buffer layer 160 and the second stress buffer layer 150 may be at the interface between the first electrode layer 130 and the dielectric layer 170. The integrated circuit device 200 may help further reduce lattice mismatch between crystal lattices at the interface between the first electrode layer 130 and the dielectric layer 170, thereby reducing the occurrence of a leakage current and improving the characteristics of the dielectric layer 170.

Figure 3:
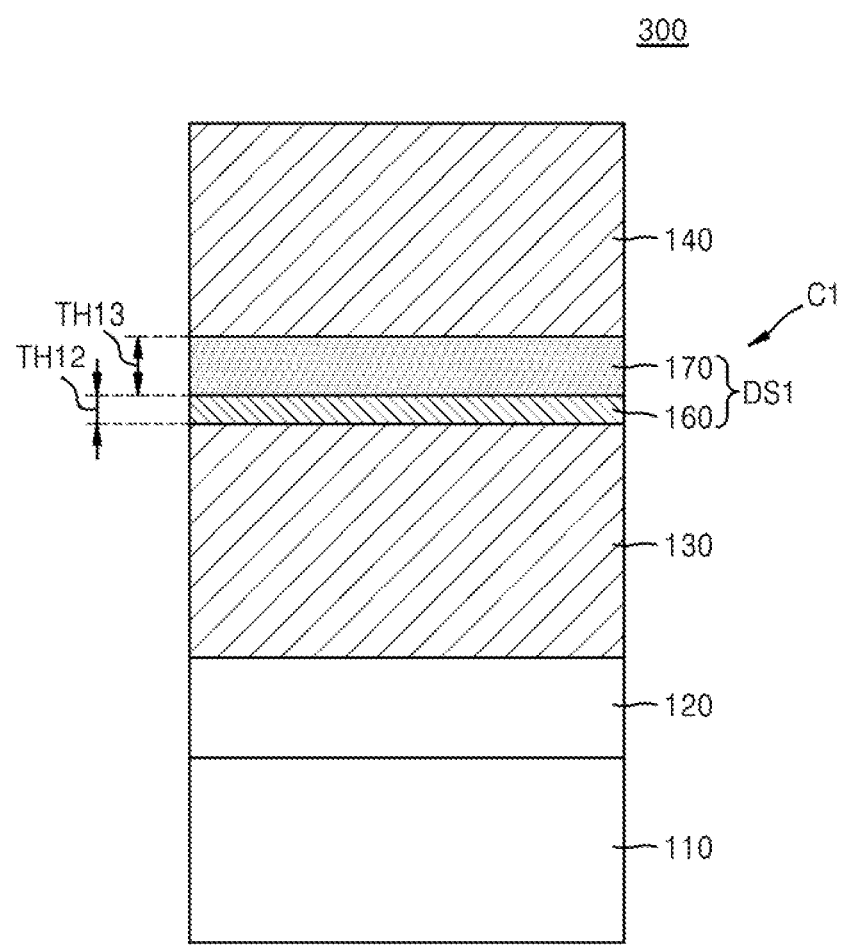
FIG. 3 is a cross-sectional view of a main configuration of an integrated circuit device according to an embodiment.

FIG. 3 is a cross-sectional view of a main configuration of an integrated circuit device according to an embodiment.

An integrated circuit device 300 may be the same as the integrated circuit device 100 of FIG. 1 except that a second electrode layer 140 may be on the dielectric layer 170. In FIG. 3, reference numerals identical to those as in FIG. 1 denote the same elements. In FIG. 3, descriptions of elements denoted by the same reference numerals as in FIG. 1 may be briefly given or omitted.

The integrated circuit device 300 may include the substrate 110, the lower structure 120 on the substrate 110, the first electrode layer 130 on the lower structure 120, the dielectric structure DS1 on the first electrode layer 130, and the second electrode layer 140 on the dielectric structure DS1. The dielectric structure DS1 may include the first stress buffer layer 160 and the dielectric layer 170.

The first electrode layer 130, the dielectric structure DS1, and the second electrode layer 140 may constitute a capacitor C1. The first electrode layer 130 may be a lower electrode layer. The second electrode layer 140 may be an upper electrode layer facing the lower electrode layer. The dielectric structure DS1 may be between the lower electrode layer and the upper electrode layer.

The second electrode layer 140, e.g., the upper electrode layer, may include the same material as the first electrode layer 130, e.g., the lower electrode layer. In an implementation, the second electrode layer 140 may include a metal film formed of the first metal, a metal nitride film including the first metal, or a combination thereof.

In an implementation, the first metal of the second electrode layer 140 may be Ti, Cr, Nb, Ni, Ge, Sn, Ge, Ir, Mo, Os, Pb, Ru, Sn, Ta, or W. In an implementation, the second electrode layer 140 may include Ti, Ti nitride, Cr, Cr nitride, Nb, Nb nitride, or a combination thereof. In an implementation, the second electrode layer 140 may include TiN, CrN, NbN, or a combination thereof.

Figure 4:
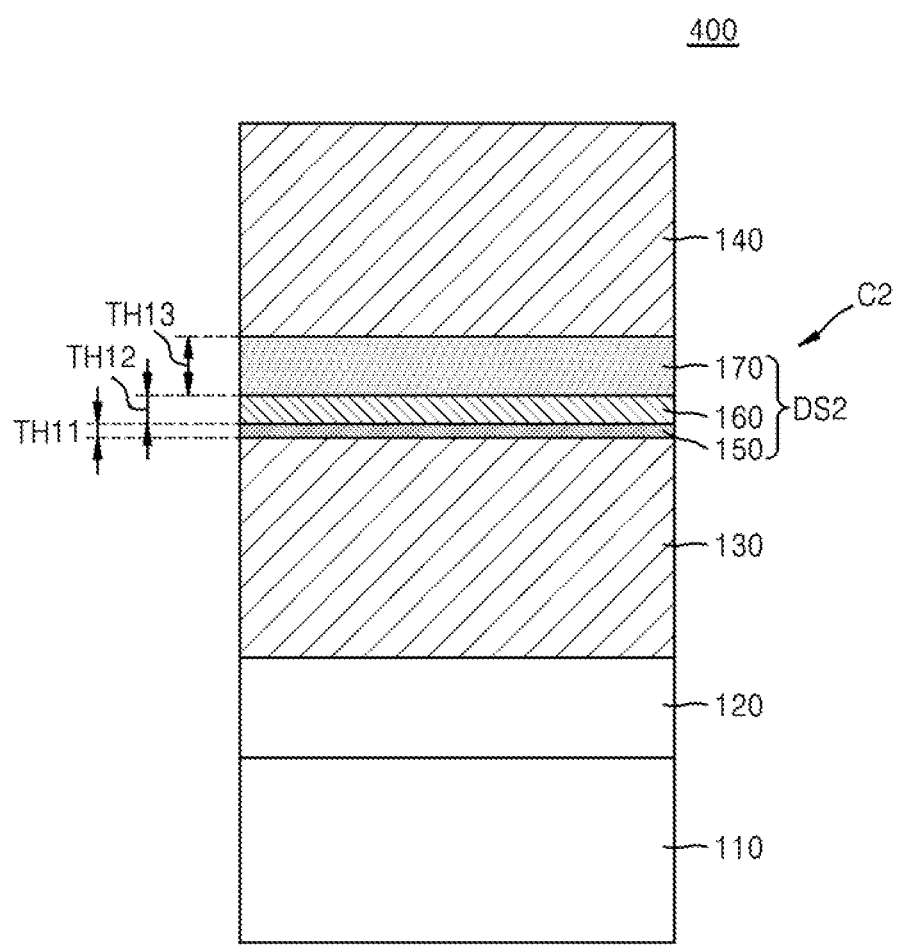
FIG. 4 is a cross-sectional view of a main configuration of an integrated circuit device according to an embodiment.

FIG. 4 is a cross-sectional view of a main configuration of an integrated circuit device according to an embodiment.

An integrated circuit device 400 may be the same as the integrated circuit device 200 of FIG. 2 except that the second electrode layer 140 may be on the dielectric layer 170. In FIG. 4, reference numerals identical to those as in FIG. 2 denote the same elements. In FIG. 4, descriptions of elements denoted by the same reference numerals as in FIG. 2 may be briefly given or omitted.

The integrated circuit device 400 may include the substrate 110, the lower structure 120 on the substrate 110, the first electrode layer 130 on the lower structure 120, the dielectric structure DS2 on the first electrode layer 130, and the second electrode layer 140 on the dielectric structure DS2. The dielectric structure DS2 may include the first stress buffer layer 160, the second stress buffer layer 150, and the dielectric layer 170.

The first electrode layer 130, the dielectric structure DS2, and the second electrode layer 140 may constitute a capacitor C2. The first electrode layer 130 may be a lower electrode layer. The second electrode layer 140 may be an upper electrode layer facing the lower electrode layer. The dielectric structure DS2 may be between the lower electrode layer and the upper electrode layer.

The second electrode layer 140, e.g., the upper electrode layer, may include the same material as the first electrode layer 130, e.g., the lower electrode layer. In an implementation, the second electrode layer 140 may include a metal film formed of the first metal, a metal nitride film including the first metal, or a combination thereof.

In an implementation, the first metal of the second electrode layer 140 may be Ti, Cr, Nb, Ni, Ge, Sn, Ge, Ir, Mo, Os, Pb, Ru, Sn, Ta, or W. In an implementation, the second electrode layer 140 may include Ti, Ti nitride, Cr, Cr nitride, Nb, Nb nitride, or a combination thereof. In an implementation, the second electrode layer 140 may include TiN, CrN, NbN, or a combination thereof.

Figure 5A:
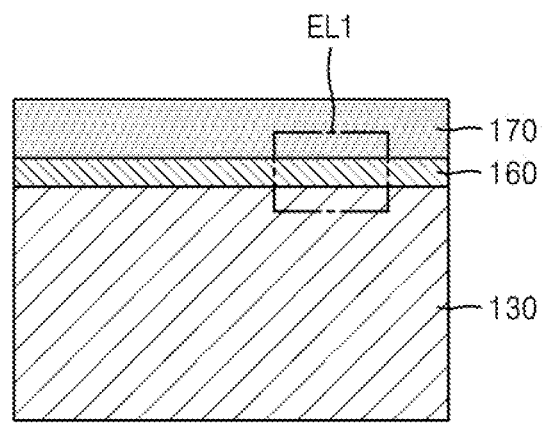
FIGS. 5A and 5B are diagrams of an arrangement of crystal lattices between a first electrode layer and a dielectric layer of an integrated circuit device according to an embodiment.
Figure 5B:
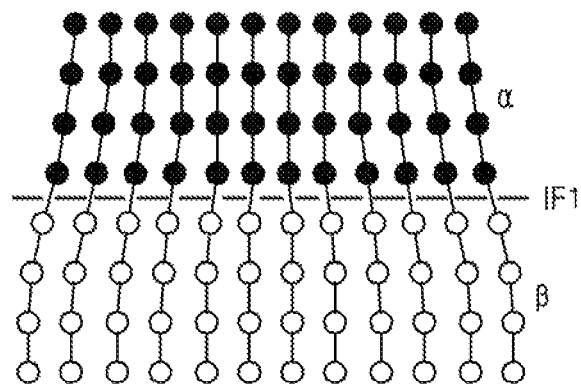

FIGS. 5A and 5B are diagrams showing an arrangement of crystal lattices between a first electrode layer and a dielectric layer of an integrated circuit device according to an embodiment.

FIG. 5B is a diagram showing a crystal lattice arrangement of a region EL1 of FIG. 5A. As described above, an integrated circuit device may include the first electrode layer 130, the first stress buffer layer 160, and the dielectric layer 170.

As shown in FIGS. 5A and 5B, an interface IF1 may be between a first portion including the first electrode layer 130 and the first stress buffer layer 160 and a second portion including the dielectric layer 170. The first portion including the first electrode layer 130 and the first stress buffer layer 160 may have first crystal lattices β. The second portion including the dielectric layer 170 may have second crystal lattices α.

As shown in FIGS. 5A and 5B, the first stress buffer layer 160 may be present, and the integrated circuit device may have no crystal defect at the interface IF1 between the first crystal lattices β and the second crystal lattices α, and lattice mismatch may be insignificant.

In the integrated circuit device according to an embodiment, there may be no crystal defect between the first stress buffer layer 160 and the dielectric layer 170 and lattice mismatch may be insignificant. Thus, a leakage current may be reduced and characteristics of the dielectric layer 170 may be improved.

Figure 6A:
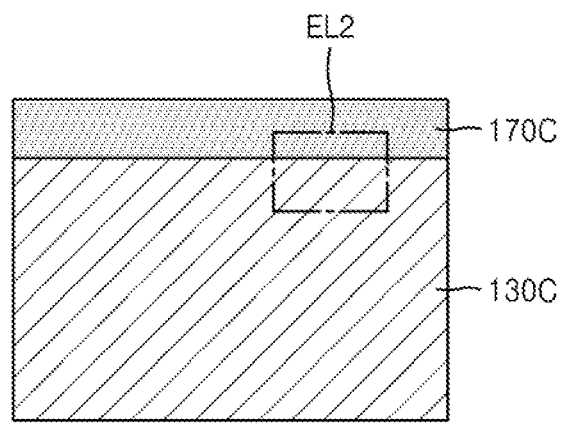
FIGS. 6A and 6B are diagrams of a lattice arrangement at the interface between a first electrode layer and a dielectric layer of an integrated circuit device according to a comparative example, for comparison with FIGS. 5A and 5B.
Figure 6B:
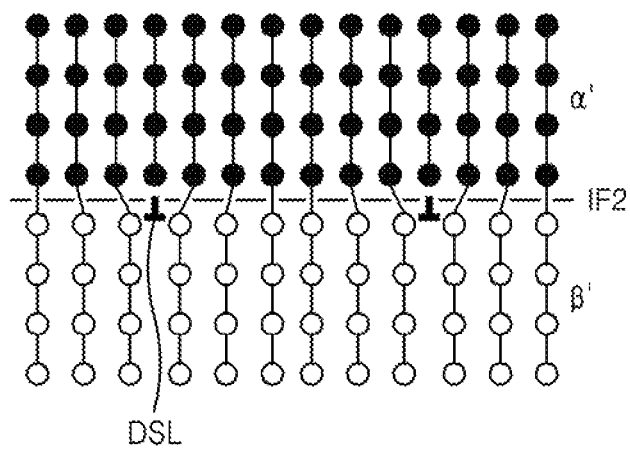

FIGS. 6A and 6B are diagrams showing a lattice arrangement at an interface between a first electrode layer and a dielectric layer of an integrated circuit device according to a comparative example, for comparison with FIGS. 5A and 5B.

FIG. 6B is a diagram showing a crystal lattice arrangement of a region EL2 of FIG. 6A. The integrated circuit device according to the comparative example may include a first electrode layer 130C and a dielectric layer 170C (e.g., directly on the first electrode layer 130C). The first electrode layer 130C and the dielectric layer 170C may correspond to the first electrode layer 130 and the dielectric layer 170, respectively.

As shown in FIGS. 6A and 6B, an interface IF2 may be between a first portion including the first electrode layer 130C and a second portion including the dielectric layer 170C. The first portion including the first electrode layer 130C may have first crystal lattices β'. The second portion including the dielectric layer 170C may have second crystal lattices β'.

As shown in FIGS. 6A and 6B, in the integrated circuit device according to the comparative example, a crystal defect DSL (e.g., a dislocation) occurs at the interface IF2 between the first crystal lattices β' and the second crystal lattices α', and lattice mismatch is significant.

In the integrated circuit device according to the comparative example, there is a crystal defect between the first electrode layer 130C and the dielectric layer 170C, and lattice mismatch is also significant. Therefore, a leakage current may be high and characteristics of the dielectric layer 170C may be poor.

FIGS. 7, 8A, 8B, and 9 are cross-sectional diagrams for describing a method of manufacturing an integrated circuit device, according to an embodiment.

In detail, FIGS. 7, 8A, 8B, and 9 are diagrams of stages in a method of manufacturing the integrated circuit device 100 of FIG. 1. In FIGS. 7, 8A, 8B, and 9, a substrate (110 of FIG. 1) and a lower structure (120 of FIG. 1) are omitted for convenience of illustration. In FIGS. 7, 8A, 8B, and 9, reference numerals identical to those as in FIG. 1 denote the same elements. In FIGS. 7, 8A, 8B, and 9, descriptions of elements denoted by the same reference numerals as in FIG. 1 may be briefly given or omitted.

Figure 7:
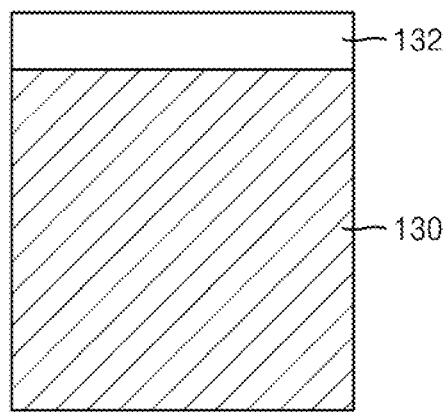
FIGS. 7, 8A, 8B, and 9 are cross-sectional diagrams of stages in a method of manufacturing an integrated circuit device, according to an embodiment.

Referring to FIG. 7, the first electrode layer 130 may be formed on a lower structure (120 of FIG. 1). The first electrode layer 130 may be formed using, e.g., chemical vapor deposition (CVD), metal organic CVD (MOCVD), physical vapor deposition (PVD), or atomic layer deposition (ALD). The first electrode layer 130 may be deposited at a temperature of about 400° C. to about 700° C. The first electrode layer 130 may include a first metal and may have a first thermal expansion coefficient.

The first thermal expansion coefficient of the first electrode layer 130 may be $8.0 \times 10^{-6}$/K or higher. In an implementation, the first thermal expansion coefficient of the first electrode layer 130 may be about $9.0 \times 10^{-6}$/K. In an implementation, the first electrode layer 130 may be formed to a thickness of 100 Å or greater.

The first metal may be a transition metal or a post-transition metal. The first electrode layer 130 may include a metal (e.g., non-compounded metal) film formed of the first metal, a metal nitride film including the first metal, or a combination thereof. In an implementation, the first electrode layer 130 may include TiN.

An amorphous first metal oxide 132 including the first metal may be formed on the first electrode layer 130. The amorphous first metal oxide 132 may be obtained or formed by oxidizing a surface of the first electrode layer 130. In an implementation, the amorphous first metal oxide 132 may be amorphous titanium oxide ($TiO_x$). In an implementation, the amorphous first metal oxide 132 may be formed to a thickness from about 10 Å to about 20 Å.

Figure 8A:
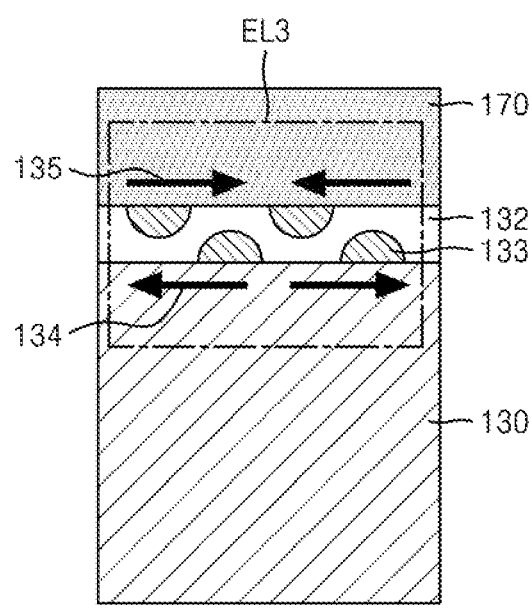
Figure 8B:
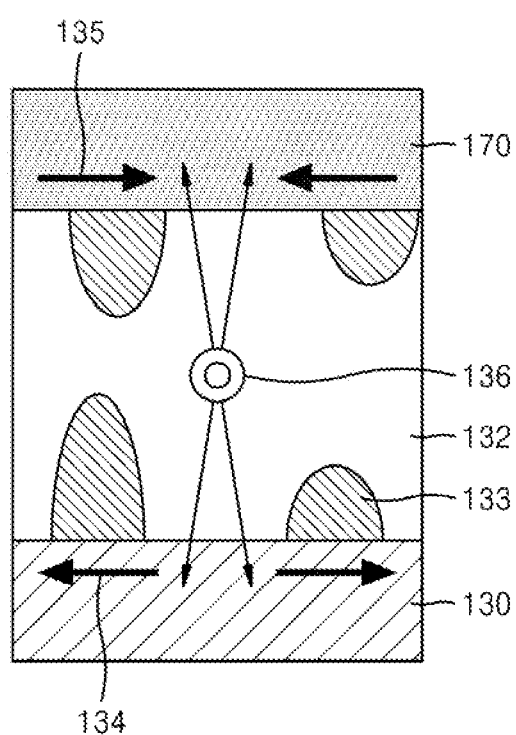

FIGS. 8A and 8B illustrate a process of crystallizing the amorphous first metal oxide 132. FIG. 8B is an enlarged view of a region EL3 of FIG. 8A.

As shown in FIGS. 8A and 8B, after the dielectric layer 170 is formed on the amorphous first metal oxide 132, an annealing process may be performed. The dielectric layer 170 may include a second metal oxide including a second metal that is different from the above-described first metal. In an implementation, the second metal may be Hf or Zr.

In an implementation, the second metal oxide constituting the dielectric layer 170 may include $HfO_2$ or $ZrO_2$. In an implementation, a thickness of the dielectric layer 170 may be from about 10 Å to about 100 Å. The dielectric layer 170 may be formed using, e.g., CVD, MOCVD, PVD, or ALD. In an implementation, the dielectric layer 170 may be deposited at a temperature lower than or equal to 400° C. In an implementation, the dielectric layer 170 may be annealed at a temperature of about 200° C. to about 700° C.

The dielectric layer 170 may have a second thermal expansion coefficient that is less than the first thermal expansion coefficient of the first electrode layer 130. In an implementation, the second thermal expansion coefficient of the dielectric layer 170 may be about $4.0 \times 10^{-6}$/K. In an implementation, a difference between the first thermal expansion coefficient of the first electrode layer 130 and the second thermal expansion coefficient of the dielectric layer 170 may be about $5.0 \times 10^{-6}$/K.

Due to a difference between thermal expansion coefficients of the first electrode layer 130 and the dielectric layer 170, thermal stresses 134 and 135 may be applied to the amorphous first metal oxide 132, and crystallization of the amorphous first metal oxide 132 may occur as shown in FIGS. 8A and 8B.

In an implementation, tensile stress 134 may occur in the first electrode layer 130 due to the difference between thermal expansion coefficients of the first electrode layer 130 and the dielectric layer 170. Compressive stress 135 may occur in the dielectric layer 170 due to the difference between thermal expansion coefficients of the first electrode layer 130 and the dielectric layer 170.

The tensile stress 134 of the first electrode layer 130 and the compressive stress 135 of the dielectric layer 170 may be applied to the amorphous first metal oxide 132. In an implementation, crystal cores 133 may be formed in the amorphous first metal oxide 132 as shown in FIG. 8A, and the crystal cores 133 may gradually grow as shown in FIG. 8B.

In an implementation, an oxygen atom 136 in the amorphous first metal oxide 132 may move to the first electrode layer 130 or the dielectric layer 170 as shown in FIG. 8B and may cure defects of the first electrode layer 130 and the dielectric layer 170.

Figure 9:
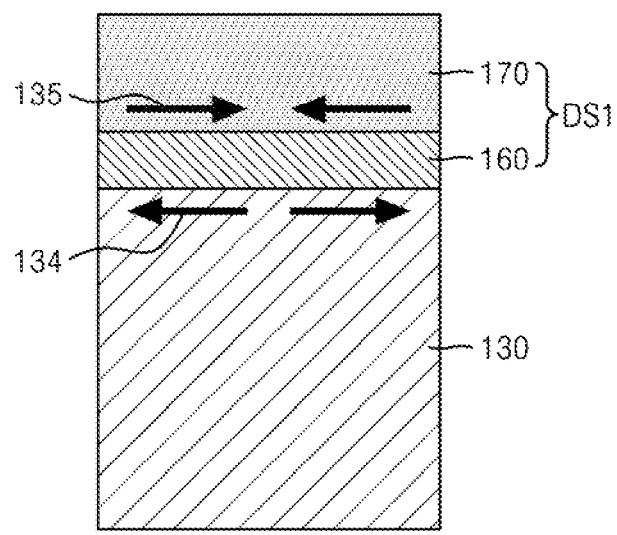

Referring to FIG. 9, during a process of forming the dielectric layer 170 or a process of annealing the dielectric layer 170, the amorphous first metal oxide 132 may be crystallized to form the first stress buffer layer 160. In an implementation, the first stress buffer layer 160 may be formed to a thickness from about 10 Å to about 20 Å. As described above, the first stress buffer layer 160 may be a crystalline layer formed by the thermal stress of the first electrode layer 130 and the thermal stress of the dielectric layer 170.

The first stress buffer layer 160 may be formed by the thermal stress of the first electrode layer 130 and the thermal stress of the dielectric layer 170, and the first stress buffer layer 160 may reduce lattice mismatch between the first electrode layer 130 and the dielectric layer 170. The first stress buffer layer 160 may have a rutile-shaped tetragonal crystal structure. The first stress buffer layer 160 and the dielectric layer 170 may constitute the dielectric structure DS1.

In an implementation, the first stress buffer layer 160 may include the first metal oxide including the first metal. The first metal may be Ti, Cr, Nb, Ni, Ge, Sn, Ge, Ir, Mo, Os, Pb, Ru, Sn, Ta, or W.

In an implementation, the first metal oxide constituting the first stress buffer layer 160 may include Ti oxide, Cr oxide, Nb oxide, Ru oxide, Ni oxide, or the like. In an implementation, the first stress buffer layer 160 may be titanium oxide.

Figure 10A:
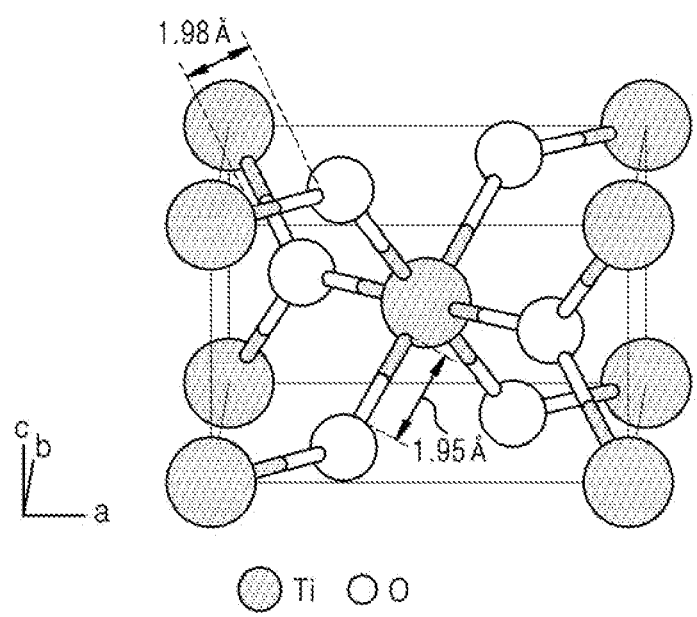
FIGS. 10A and 10B are diagrams of a crystal structure of a first stress buffer layer of an integrated circuit device according to an embodiment.
Figure 10B:
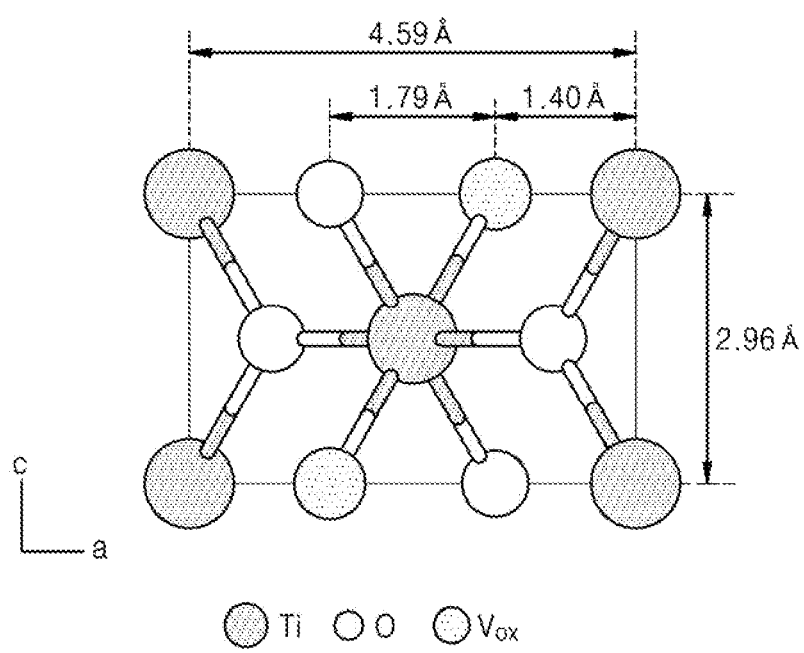

FIGS. 10A and 10B are diagrams of a crystal structure of a first stress buffer layer of an integrated circuit device according to an embodiment.

In an implementation, the first stress buffer layer (160 of FIG. 1) of an integrated circuit device may have a rutile-shaped tetragonal crystal structure as shown in FIGS. 10A and 10B. In FIGS. 10A and 10B, for convenience of explanation, it is assumed that the first stress buffer layer (160 of FIG. 1) includes titanium oxide.

Here, the rutile-shaped tetragonal crystal structure will be briefly described. As shown in FIGS. 10A and 10B, the rutile-shaped crystal structure of the first stress buffer layer (160 of FIG. 1) may have different lattice constants in the a-axis direction and the c-axis direction.

In an implementation, in the first stress buffer layer, as shown in FIG. 10B, a distance between lattices of the first stress buffer layer in the a-axis direction may be about 4.59 Å, and a distance between lattices of the first stress buffer layer in the c-axis direction may be about 2.96 Å. In FIG. 10B, Vox may denote an oxygen vacancy.

Figure 11:
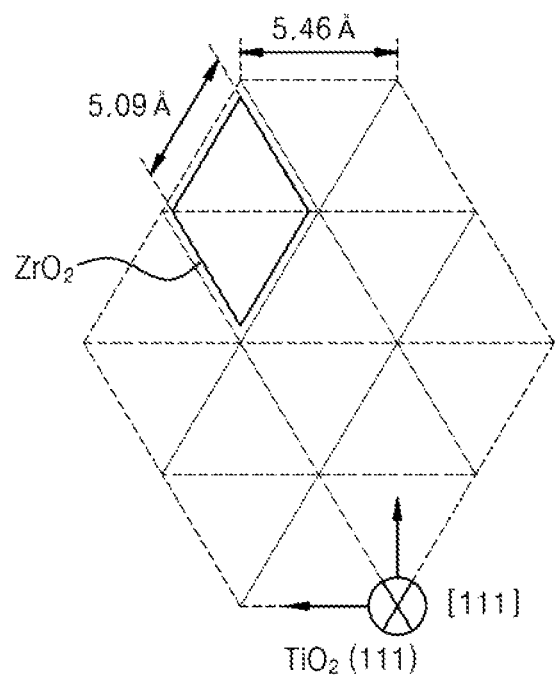
FIG. 11 is a diagram of lattice mismatch of an integrated circuit device according to an embodiment.
Figure 12:
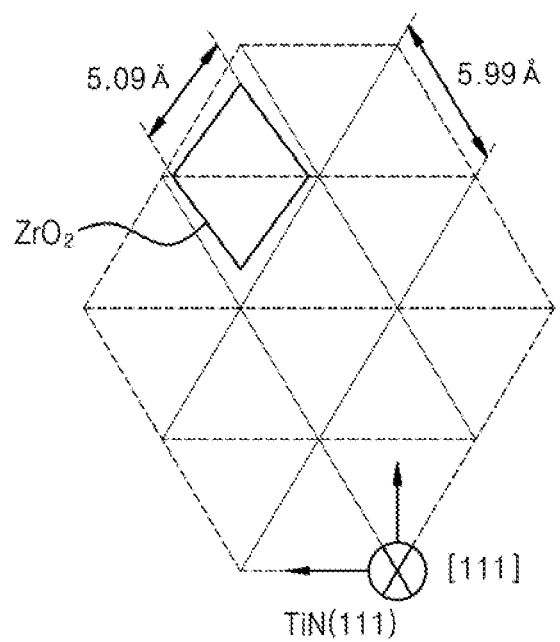
FIG. 12 is a diagram of lattice mismatch of an integrated circuit device according to a comparative example for comparison with FIG. 11.

FIG. 11 is a diagram of lattice mismatch of an integrated circuit device according to an embodiment, and FIG. 12 is a diagram of lattice mismatch of an integrated circuit device according to a comparative example, for comparison with the embodiment of FIG. 11.

FIG. 11 is a diagram showing a case in which the first stress buffer layer 160 is formed as shown in FIG. 5A. FIG. 11 is a diagram showing a lattice arrangement in which the first stress buffer layer (160 of FIG. 5A) includes $TiO_2$ and the dielectric layer (170 of FIG. 5A) includes $ZrO_2$ in the integrated circuit device.

As shown in FIG. 11, $TiO_2$ of the first stress buffer layer 160 on a (111) crystal plane may have a lattice constant of about 5.46 Å, and $ZrO_2$ of the dielectric layer 170 may have a lattice constant of about 5.09 Å.

In an implementation, a lattice mismatch between $TiO_2$ constituting the first stress buffer layer 160 on the (111) crystal plane and $ZrO_2$ constituting the dielectric layer 170 is about 7%.

FIG. 12 is a diagram showing a case in which the first stress buffer layer 160 is not formed, e.g., as shown in FIG. 6A. FIG. 12 is a diagram showing a lattice arrangement in which the first electrode layer (130C of FIG. 5A) includes TiN and the dielectric layer (170C of FIG. 6A) includes $ZrO_2$ in the integrated circuit device according to the comparative example.

As shown in FIG. 12, TiN of the first electrode layer 130C on the (111) crystal plane may have a lattice constant of about 5.99 Å, and $ZrO_2$ of the dielectric layer 170 may have a lattice constant of about 5.09 Å.

A lattice mismatch between TiN constituting the first electrode layer 130C on the (111) crystal plane and $ZrO_2$ of the dielectric layer 170C is about 17%. As described above, when an integrated circuit device includes the first stress buffer layer 160, lattice mismatch between the first stress buffer layer 160 and the dielectric layer 170 may be reduced.

Figure 13:
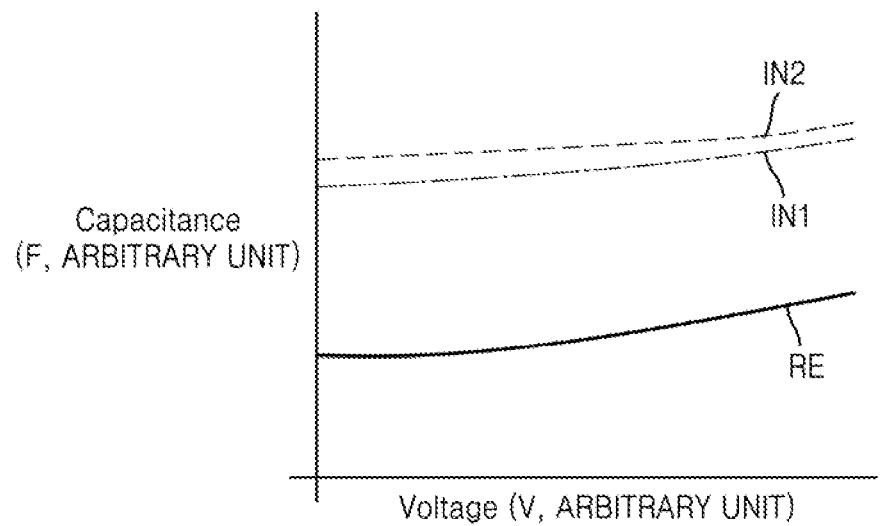
FIG. 13 is a graph showing capacitance characteristics of an integrated circuit device according to an embodiment.

FIG. 13 is a graph showing capacitance characteristics of an integrated circuit device according to an embodiment.

FIG. 13 is a graph showing capacitance characteristics of the integrated circuit device 300 of FIG. 3 and the integrated circuit device 400 of FIG. 4. IN1 represents the capacitance characteristics of the integrated circuit device 300 of FIG. 3. IN2 represents the capacitance characteristics of the integrated circuit device 400 of FIG. 4. RE relates to an integrated circuit device according to a comparative example, and, in FIGS. 3 and 4, RE indicates that the first stress buffer layer 160 and the second stress buffer layer 150 are not formed.

As shown in FIG. 13, the integrated circuit device 300 including the first stress buffer layer 160 exhibits higher capacitance than the integrated circuit device (represented by RE) of the comparative example as indicated by IN1, and the dielectric layer (170 of FIG. 3) exhibits good characteristics. Also, it may be seen that, the integrated circuit device 400 including the first stress buffer layer 160 and the second stress buffer layer 150 exhibits higher capacitance than the integrated circuit device (represented by RE) of the comparative example as indicated by IN2, and the dielectric layer (170 of FIG. 3) exhibits good characteristics.

Furthermore, it may be seen that the integrated circuit device 400 including the first stress buffer layer 160 and the second stress buffer layer 150 exhibits higher capacitance than an integrated circuit device (indicated by IN1) in the integrated circuit device 300 including only the first stress buffer layer 160 as indicated by IN2, and the dielectric layer (170 of FIG. 3) exhibits better characteristics.

Figure 14:
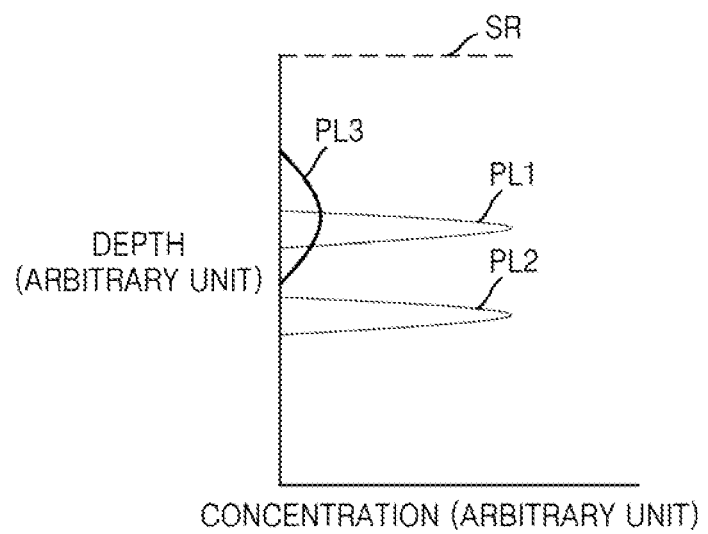
FIG. 14 is a graph showing concentrations of first and second stress buffer layers according to depths in an integrated circuit device according to an embodiment.

FIG. 14 is a graph showing concentrations of first and second stress buffer layers according to depths in an integrated circuit device according to an embodiment.

FIG. 14 shows concentration profiles PL1, PL2, and PL3 of a first stress buffer layer (160 of FIG. 1) and a second stress buffer layer (150 of FIG. 2) according to depths from surfaces SR of dielectric layers 170 of the integrated circuit device 100 of FIG. 1 and the integrated circuit device 200 of FIG. 2.

As shown in FIG. 14, the concentrations of oxygen atoms in the first stress buffer layer (160 of FIG. 1) and the second stress buffer layer (150 of FIG. 2) may have a maximum value at a predetermined depth from the surface SR of the dielectric layer 170 as indicated by PL3.

A concentration of titanium atoms in the first stress buffer layer (160 of FIG. 1) may have a maximum value at a predetermined depth from the surface SR of the dielectric layer 170 as indicated by PL1. A concentration of titanium atoms in the second stress buffer layer (150 of FIG. 2) may have a maximum value at a predetermined depth from the surface SR of the dielectric layer 170 as indicated by PL2. The predetermined depth indicated by PL2 may be greater, e.g., deeper, than the predetermined depth indicated by PL1. The concentration of titanium atoms in the first stress buffer layer (160 of FIG. 1) and the second stress buffer layer (150 of FIG. 2) may be higher than the concentration of oxygen atoms.

Figure 15A:
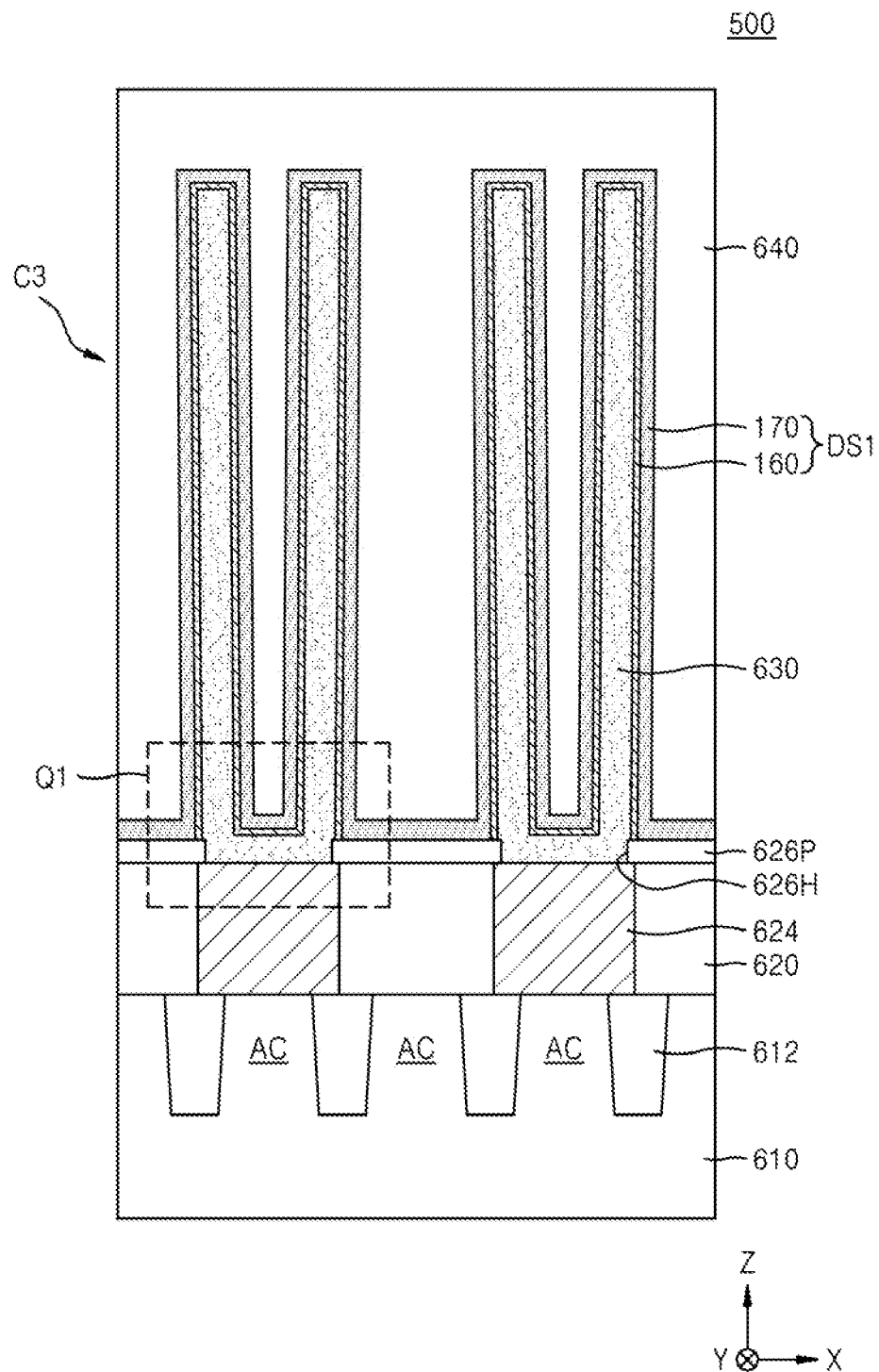
FIG. 15A is a cross-sectional diagram of an integrated circuit device according to an embodiment.
Figure 15B:
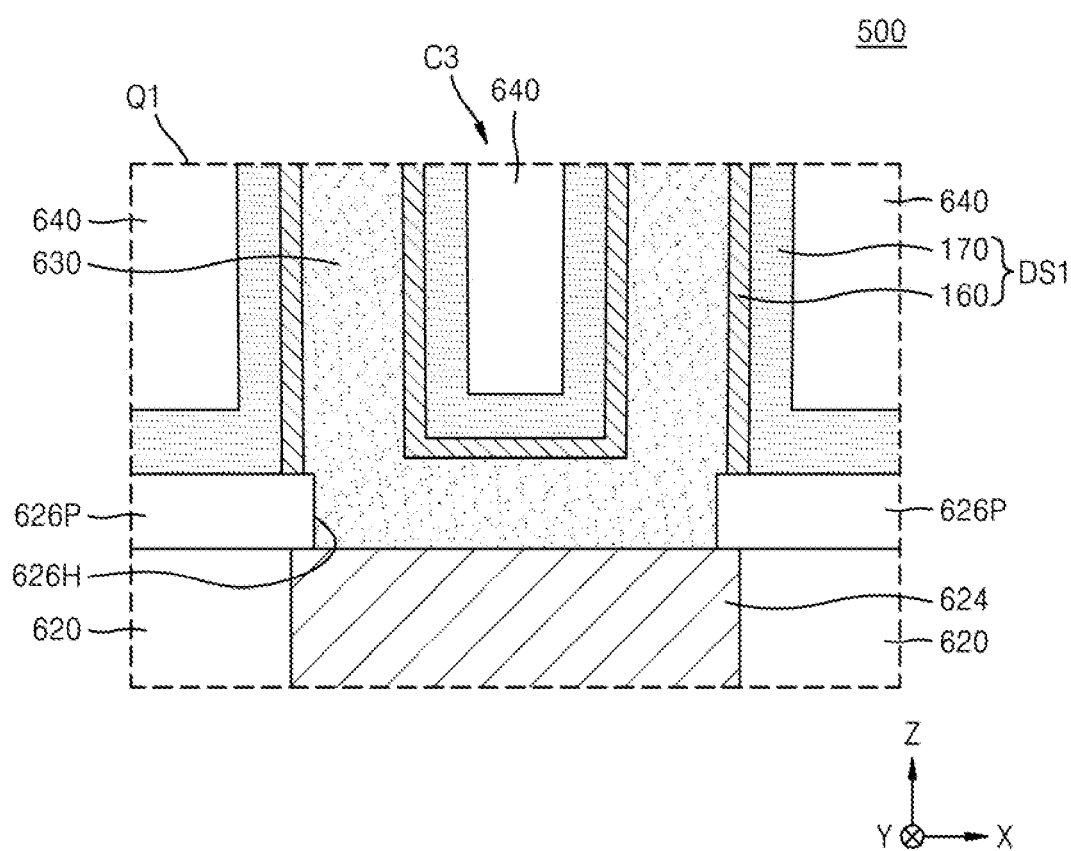
FIG. 15B is an enlarged cross-sectional view of a region Q1 in FIG. 15A.

FIG. 15A is a cross-sectional diagram of an integrated circuit device according to an embodiment, and FIG. 15B is an enlarged cross-sectional view of a region Q1 in FIG. 15A.

In FIGS. 15A and 15B, reference numerals identical to those as in FIGS. 1 and 3 denote the same elements. In FIGS. 15A and 15B, descriptions of elements denoted by the same reference numerals as in FIGS. 1 and 3 may be briefly given or omitted.

An integrated circuit device 500 may include a substrate 610, which includes a plurality of active regions AC, and an interlayer insulation layer 620 on the substrate 610. A plurality of conductive regions 624 may penetrate through the interlayer insulation layer 620 and be connected to the active regions AC.

The substrate 610 may have substantially the same configuration as that described for the substrate 110 with reference to FIGS. 1 and 3. The active regions AC may be defined by a plurality of device isolation regions 612 in the substrate 610. A device isolation region 612 may include an oxide film, a nitride film, or a combination thereof. The interlayer insulation layer 620 may include a silicon oxide layer. The conductive region 624 may include poly-silicon, a metal, conductive metal nitride, metal silicide, or a combination thereof.

An insulation pattern 626P having a plurality of openings 626H may be on the interlayer insulation layer 620 and the conductive regions 624. The insulation pattern 626P may include silicon nitride, silicon oxynitride, or a combination thereof.

A plurality of capacitors C3 may be on the conductive regions 624. The capacitors C3 may include a lower electrode layer 630 and an upper electrode layer 640. The capacitors C3 may share one upper electrode layer 640. The lower electrode layers 630 may each have a cylindrical shape or a cup shape with a closed bottom surface facing the substrate 610. More detailed configurations of the lower electrode layer 630 and the upper electrode layer 640 are substantially the same as those of the first electrode layer 130 and the second electrode layer 140 described with reference to FIGS. 1 and 3, respectively.

Each of the capacitors C3 may further include the dielectric structure DS1 between the lower electrode layer 630 and the upper electrode layer 640. The dielectric structure DS1 may include the first stress buffer layer 160 and the dielectric layer 170. The first stress buffer layer 160 and the dielectric layer 170 may be substantially the same as those described with reference to FIGS. 1 and 3, respectively.

The first stress buffer layer 160 may cover the surfaces of the lower electrode layers 630. The dielectric layer 170 may continuously extend on the substrate 610 to cover the surface of the first stress buffer layer 160 and to cover the top surface of the insulation pattern 626P between the lower electrode layers 630. The upper electrode layer 640 may cover the dielectric layer 170.

The dielectric structure DS1 of the capacitors C3 in the integrated circuit device 500 described with reference to FIGS. 15A and 15B may include the first stress buffer layer 160 and the dielectric layer 170 sequentially stacked on the lower electrode layer 630. The bottom surface of the first stress buffer layer 160 may be in contact (e.g., direct contact) with the lower electrode layer 630, and the top surface of the first stress buffer layer 160 may be in contact (e.g., direct contact) with the dielectric layer 170.

As described above, the first stress buffer layer 160 may be formed by thermal stress of the lower electrode layer 630 and thermal stress of the dielectric layer 170. In the integrated circuit device 500, the first stress buffer layer 160 may be between the lower electrode layer 630 and the dielectric layer 170, thereby reducing the occurrence of a leakage current and also improving the characteristics of the dielectric layer 170.

Figure 16A:
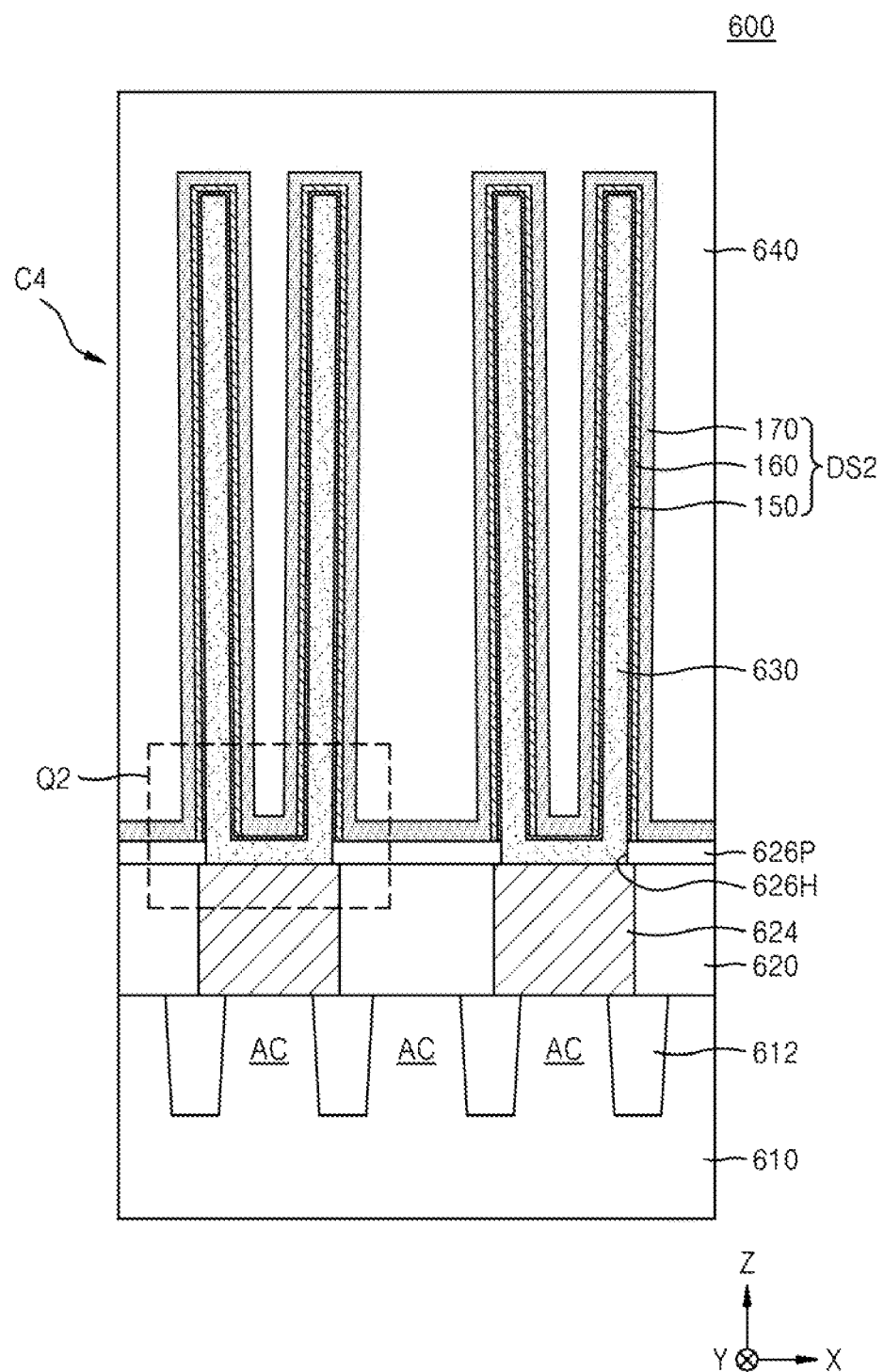
FIG. 16A is a cross-sectional diagram of an integrated circuit device according to an embodiment.
Figure 16B:
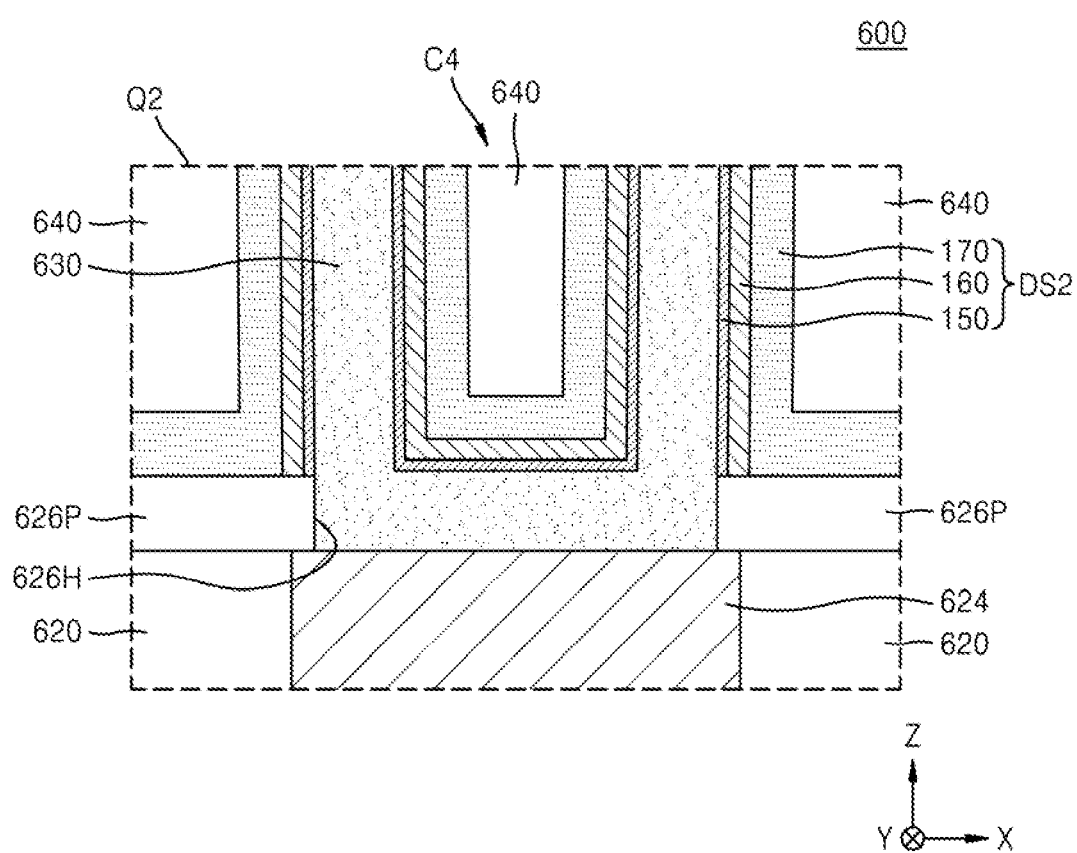
FIG. 16B is an enlarged cross-sectional view of a region Q2 in FIG. 16A.

FIG. 16A is a cross-sectional diagram of an integrated circuit device according to an embodiment, and FIG. 16B is an enlarged cross-sectional view of a region Q2 in FIG. 16A.

In FIGS. 16A and 16B, reference numerals identical to those as in FIGS. 2, 4, 15A, and 15B denote the same elements. In FIGS. 16A and 16B, descriptions of elements denoted by the same reference numerals as in FIGS. 2, 4, 15A, and 15B may be briefly given or omitted.

An integrated circuit device 600 may include the substrate 610, which includes the active regions AC, and the interlayer insulation layer 620 on the substrate 610. An insulation pattern 626P having a plurality of openings 626H may be on the interlayer insulation layer 620 and the conductive regions 624.

A plurality of capacitors C4 may be on the conductive regions 624. The capacitors C4 may include the lower electrode layer 630 and the upper electrode layer 640. The lower electrode layers 630 may each have a cylindrical shape or a cup shape with a closed bottom surface facing the substrate 610. More detailed configurations of the lower electrode layer 630 and the upper electrode layer 640 are substantially the same as those of the first electrode layer 130 and the second electrode layer 140 described with reference to FIGS. 2 and 4, respectively.

Each of the capacitors C4 may further include the dielectric structure DS2 between the lower electrode layer 630 and the upper electrode layer 640. The dielectric structure DS2 may include the second stress buffer layer 150, the first stress buffer layer 160, and the dielectric layer 170. The second stress buffer layer 150, the first stress buffer layer 160, and the dielectric layer 170 may be substantially the same as those described with reference to FIGS. 2 and 4, respectively.

The second stress buffer layer 150 may cover the surfaces of the lower electrode layers 630. The first stress buffer layer 160 may cover the surface of the second stress buffer layer 150. The dielectric layer 170 may continuously extend on the substrate 610 and may cover the surface of the first stress buffer layer 160 and the top surface of the insulation pattern 626P between the lower electrode layers 630. The upper electrode layer 640 may cover the dielectric layer 170.

The dielectric structure DS2 of the capacitors C4 in the integrated circuit device 600 described with reference to FIGS. 16A and 16B may include the second stress buffer layer 150, the first stress buffer layer 160, and the dielectric layer 170 sequentially stacked on the lower electrode layer 630. The bottom surface of the second stress buffer layer 150 is in contact with the lower electrode layer 630, and the top surface of the second stress buffer layer 150 may be in contact (e.g., direct contact) with the first stress buffer layer 160. The bottom surface of the first stress buffer layer 160 is in contact with the second stress buffer layer 150, and the top surface of the first stress buffer layer 160 may be in contact (e.g., direct contact) with the dielectric layer 170.

As described above, the second stress buffer layer 150 and the first stress buffer layer 160 may be formed by thermal stress of the lower electrode layer 630 and thermal stress of the dielectric layer 170. In the integrated circuit device 600, the second stress buffer layer 150 and the first stress buffer layer 160 may be between the lower electrode layer 630 and the dielectric layer 170, thereby reducing the occurrence of a leakage current and also improving the characteristics of the dielectric layer 170.

Figure 17A:
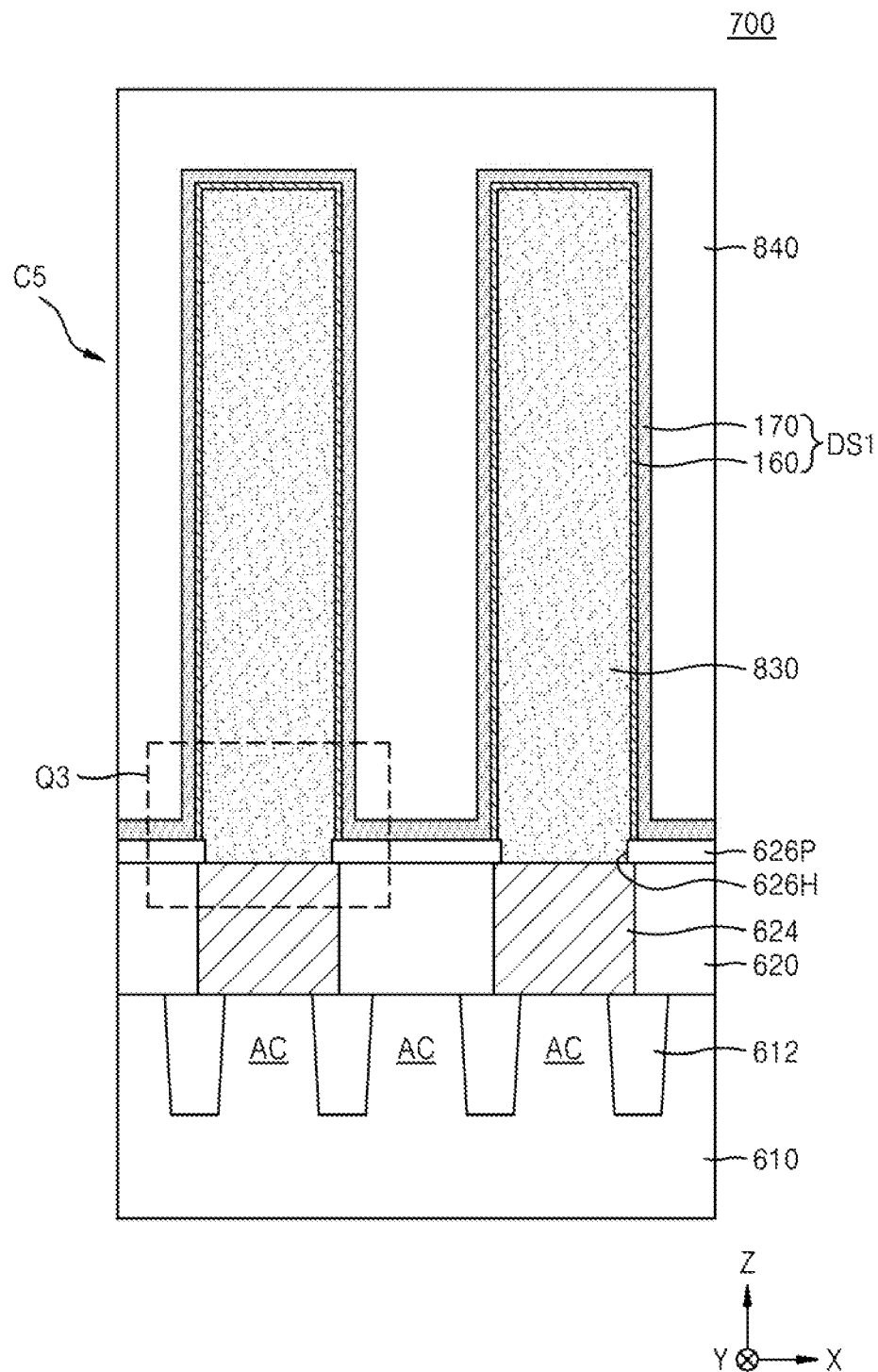
FIG. 17A is a cross-sectional diagram of an integrated circuit device according to an embodiment.
Figure 17B:
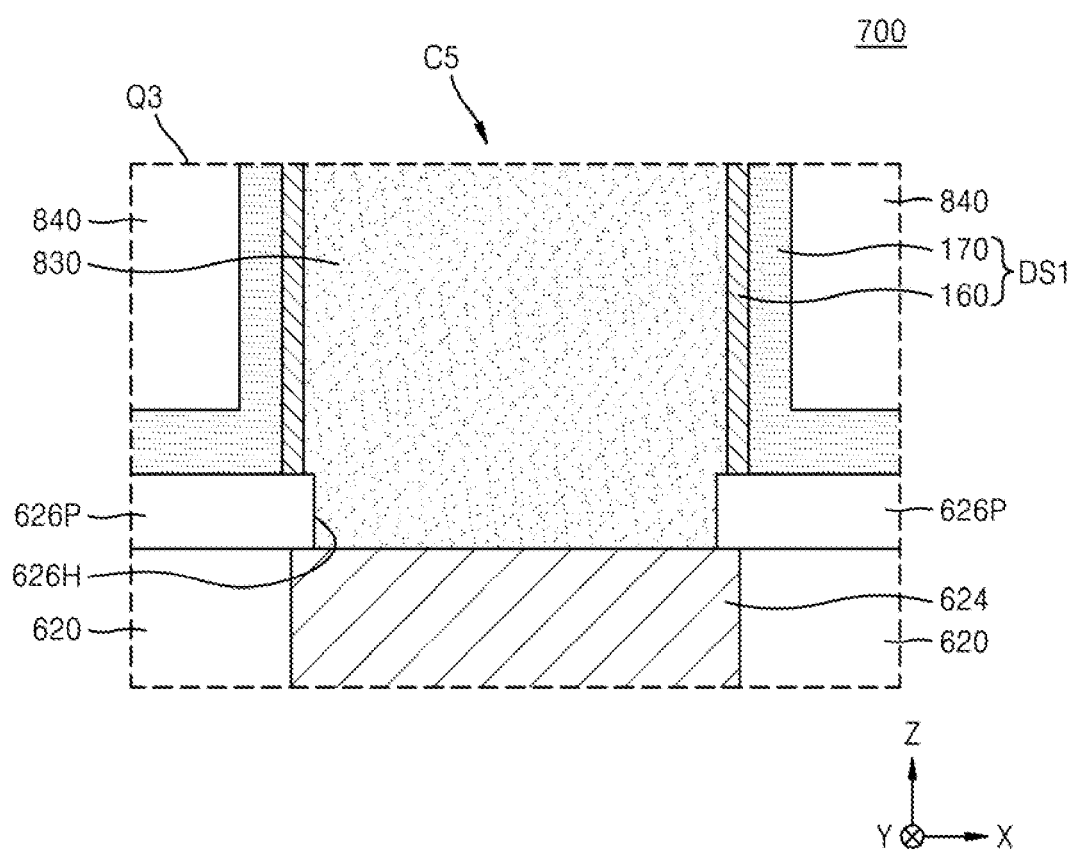
FIG. 17B is an enlarged cross-sectional view of a region Q3 in FIG. 17A.

FIG. 17A is a cross-sectional diagram of an integrated circuit device according to an embodiment, and FIG. 17B is an enlarged cross-sectional view of a region Q3 in FIG. 17A.

In FIGS. 17A and 17B, reference numerals identical to those as in FIGS. 1, 3, 15A, and 15B denote the same elements. In FIGS. 17A and 17B, descriptions of elements denoted by the same reference numerals as in FIGS. 1, 3, 15A, and 15B may be briefly given or omitted.

An integrated circuit device 700 may include the substrate 610, which includes the active regions AC, and the interlayer insulation layer 620 on the substrate 610. An insulation pattern 626P having a plurality of openings 626H may be on the interlayer insulation layer 620 and the conductive regions 624.

A plurality of capacitors C5 may be on the conductive regions 624. The capacitors C5 may include a lower electrode layer 830 and an upper electrode layer 840. The capacitors C5 may share one upper electrode layer 840. Each of the lower electrode layers 830 may have a pillar shape. More detailed configurations of the lower electrode layer 830 and the upper electrode layer 840 are substantially the same as those of the first electrode layer 130 and the second electrode layer 140 described with reference to FIGS. 1 and 3, respectively.

Each of the capacitors C5 may further include the dielectric structure DS1 between the lower electrode layer 830 and the upper electrode layer 840. The dielectric structure DS1 may include the first stress buffer layer 160 and the dielectric layer 170. The first stress buffer layer 160 and the dielectric layer 170 may be substantially the same as those described with reference to FIGS. 1 and 3, respectively.

The first stress buffer layer 160 may cover the surfaces of the lower electrode layers 830. The dielectric layer 170 may continuously extend on the substrate 610 and may cover the surface of the first stress buffer layer 160 and the top surface of the insulation pattern 626P between the lower electrode layers 830. The upper electrode layer 840 may cover the dielectric layer 170.

The dielectric structure DS1 of the capacitors C5 in the integrated circuit device 700 described with reference to FIGS. 17A and 17B may include the first stress buffer layer 160 and the dielectric layer 170 sequentially stacked on the lower electrode layer 830. The bottom surface of the first stress buffer layer 160 may be in contact (e.g., direct contact) with the lower electrode layer 830, and the top surface of the first stress buffer layer 160 may be in contact (e.g., direct contact) with the dielectric layer 170.

As described above, the first stress buffer layer 160 may be formed by thermal stress of the lower electrode layer 830 and thermal stress of the dielectric layer 170. In the integrated circuit device 700, the first stress buffer layer 160 may be between the lower electrode layer 830 and the dielectric layer 170, thereby reducing the occurrence of a leakage current and also improving the characteristics of the dielectric layer 170.

Figure 18A:
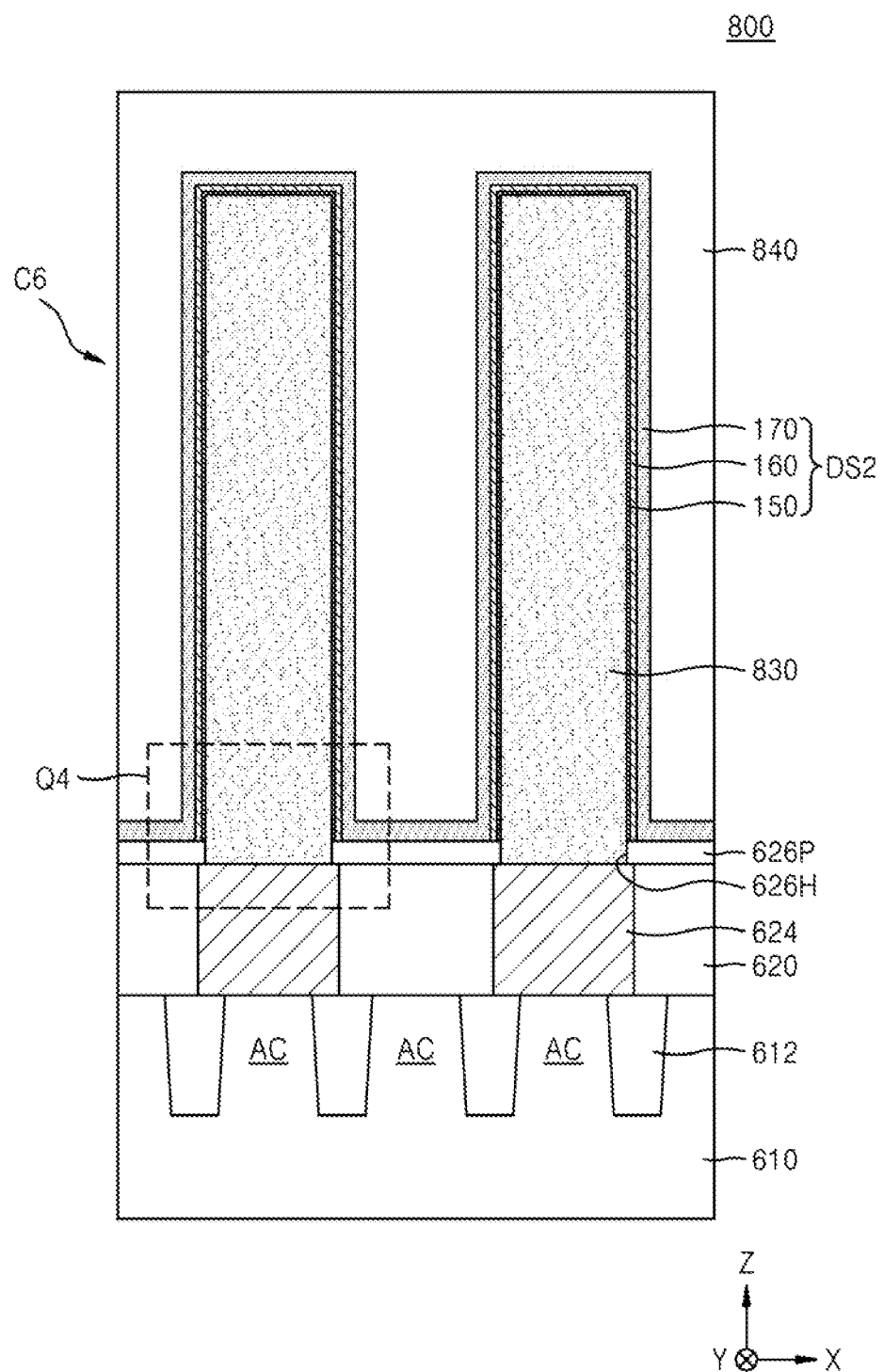
FIG. 18A is a cross-sectional diagram of an integrated circuit device according to an embodiment.
Figure 18B:
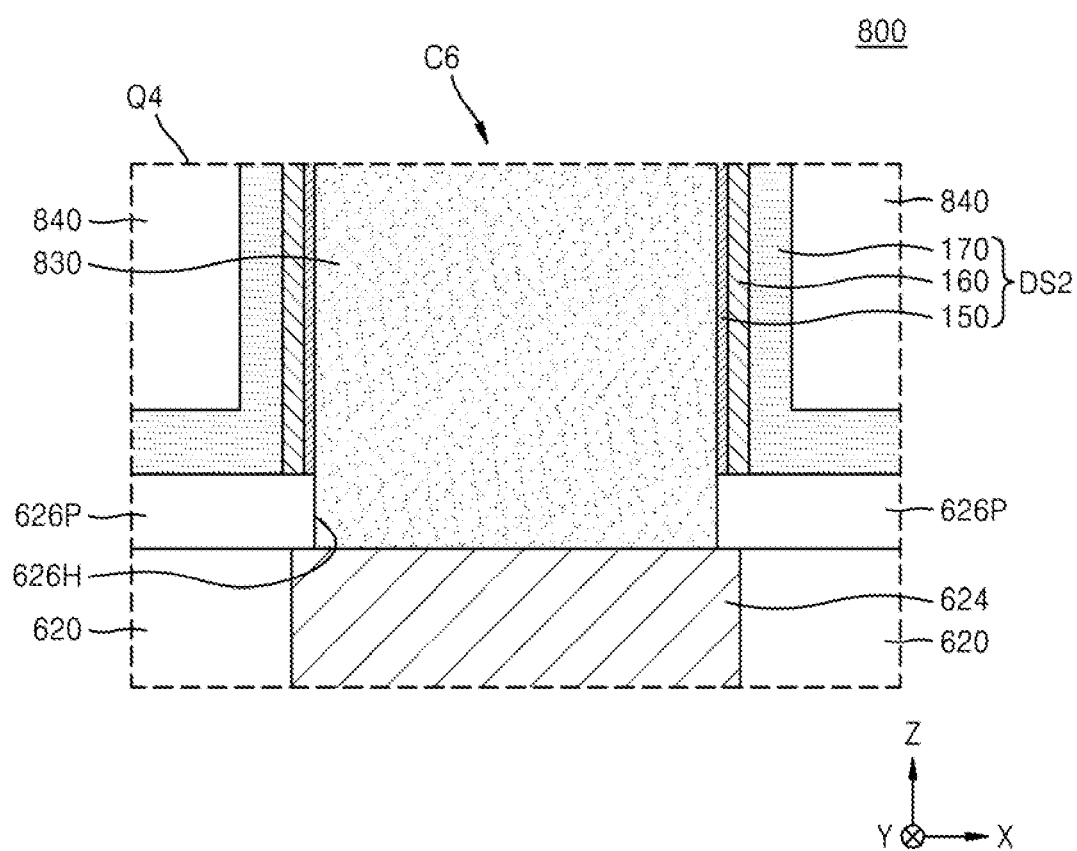
FIG. 18B is an enlarged cross-sectional view of a region Q4 in FIG. 18A.

FIG. 18A is a cross-sectional diagram of an integrated circuit device according to an embodiment, and FIG. 18B is an enlarged cross-sectional view of a region Q4 in FIG. 18A.

In FIGS. 18A and 18B, reference numerals identical to those as in FIGS. 2, 4, 17A, and 17B denote the same elements. In FIGS. 18A and 18B, descriptions of elements denoted by the same reference numerals as in FIGS. 2, 4, 17A, and 17B may be briefly given or omitted.

An integrated circuit device 800 may include the substrate 610, which includes the active regions AC, and the interlayer insulation layer 620 on the substrate 610. An insulation pattern 626P having a plurality of openings 626H may be on the interlayer insulation layer 620 and the conductive regions 624.

A plurality of capacitors C6 may be on the conductive regions 624. The capacitors C6 may include the lower electrode layer 830 and the upper electrode layer 840. Each of the lower electrode layers 830 may have a pillar shape. More detailed configurations of the lower electrode layer 830 and the upper electrode layer 840 are substantially the same as those of the first electrode layer 130 and the second electrode layer 140 described with reference to FIGS. 1 and 3, respectively.

Each of the capacitors C6 may further include the dielectric structure DS2 between the lower electrode layer 830 and the upper electrode layer 840. The dielectric structure DS2 may include the second stress buffer layer 150, the first stress buffer layer 160, and the dielectric layer 170. The second stress buffer layer 150, the first stress buffer layer 160, and the dielectric layer 170 may be substantially the same as those described with reference to FIGS. 2 and 4, respectively.

The second stress buffer layer 150 may cover the surfaces of the lower electrode layers 830. The first stress buffer layer 160 may cover the surface of the second stress buffer layer 150. The dielectric layer 170 may continuously extend on the substrate 610 and may cover the surface of the first stress buffer layer 160 and the top surface of the insulation pattern 626P between the lower electrode layers 830. The upper electrode layer 840 may cover the dielectric layer 170.

The dielectric structure DS2 of the capacitors C6 in the integrated circuit device 800 described with reference to FIGS. 18A and 18B may include the second stress buffer layer 150, the first stress buffer layer 160, and the dielectric layer 170 sequentially stacked on the lower electrode layer 630. The bottom surface of the second stress buffer layer 150 may be in contact (e.g., direct contact) with the lower electrode layer 830, and the top surface of the second stress buffer layer 150 may be in contact (e.g., direct contact) with the first stress buffer layer 160. The bottom surface of the first stress buffer layer 160 may be in contact (e.g., direct contact) with the second stress buffer layer 150, and the top surface of the first stress buffer layer 160 may be in contact (e.g., direct contact) with the dielectric layer 170.

As described above, the second stress buffer layer 150 and the first stress buffer layer 160 may be formed by thermal stress of the lower electrode layer 830 and thermal stress of the dielectric layer 170. In the integrated circuit device 800, the second stress buffer layer 150 and the first stress buffer layer 160 may be between the lower electrode layer 830 and the dielectric layer 170, thereby reducing the occurrence of a leakage current and also improving the characteristics of the dielectric layer 170.

FIGS. 19A to 19I are cross-sectional diagrams of stages in a method of manufacturing an integrated circuit device, according to an embodiment.

An example method of manufacturing the integrated circuit device 500 shown in FIGS. 15A and 15B will be described with reference to FIGS. 19A to 19I. In FIGS. 19A to 19I, reference numerals identical to those as in FIGS. 15A and 15B denote the same elements. In FIGS. 19A to 19I, descriptions of elements denoted by the same reference numerals as in FIGS. 15A and 15B may be briefly given or omitted.

Figure 19A:
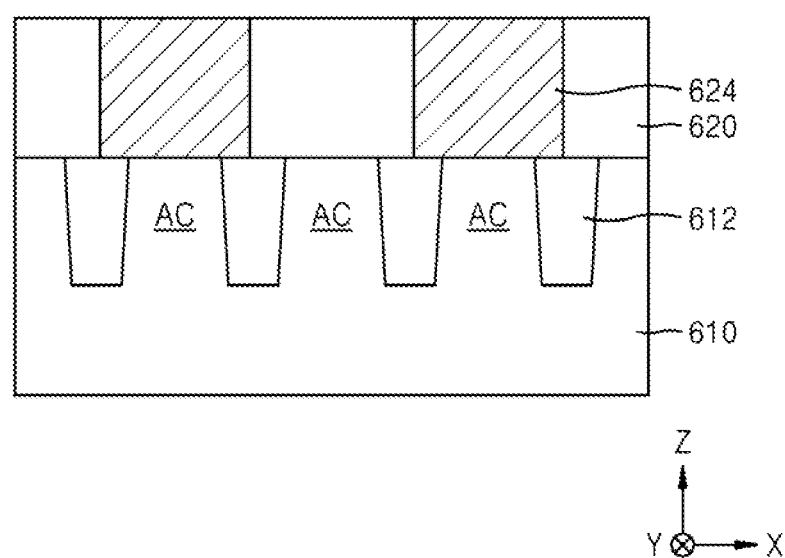
FIGS. 19A to 19I are cross-sectional diagrams of stages in a method of manufacturing an integrated circuit device, according to an embodiment.

Referring to FIG. 19A, the interlayer insulation layer 620 may be formed on the substrate 610 in which the active regions AC are defined by the device isolation region 612. Next, the conductive regions 624 penetrating through the interlayer insulation layer 620 and connected to the active regions AC may be formed.

Figure 19B:
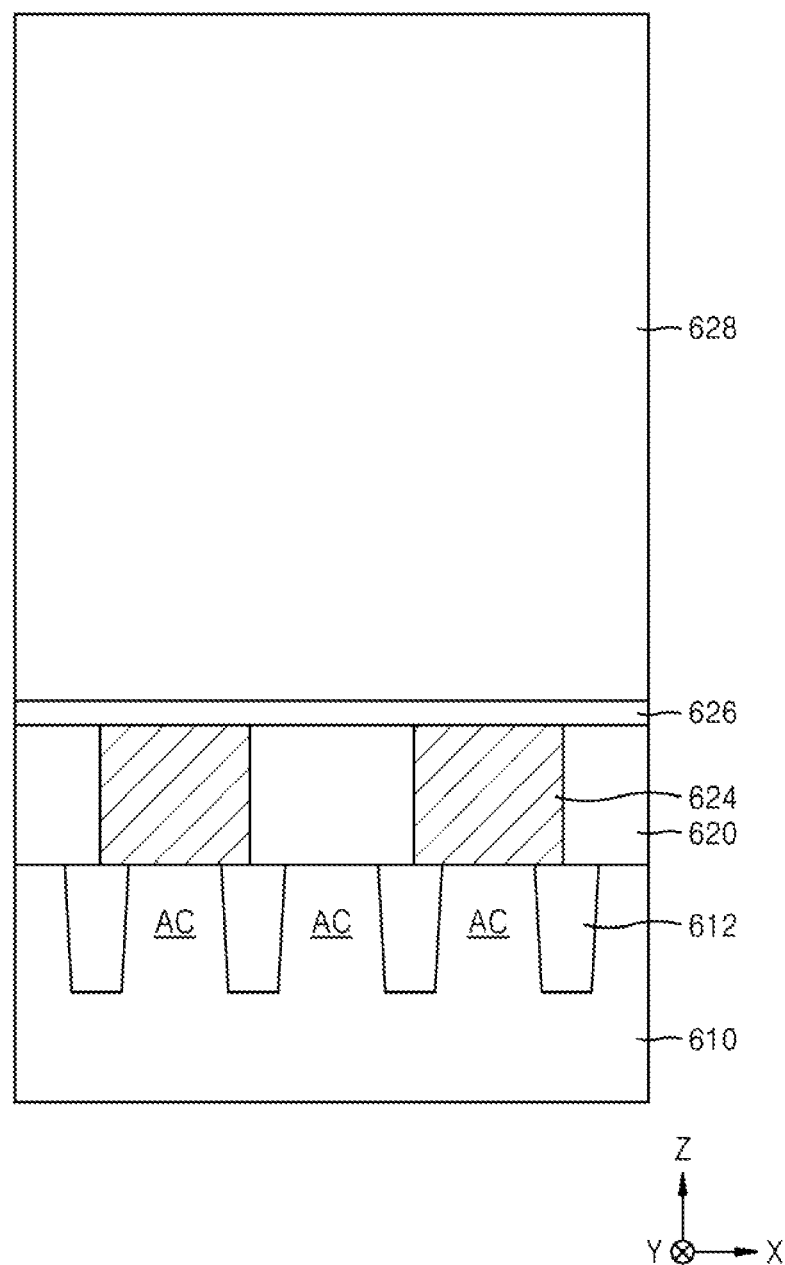

Referring to FIG. 19B, an insulation layer 626 and a mold layer 628 may be sequentially formed on the interlayer insulation layer 620 and the conductive regions 624. The insulation layer 626 may be an etch stop layer. The insulation layer 626 may include an insulating material having an etch selectivity with respect to the interlayer insulation layer 620 and the mold layer 628. In an implementation, the insulation layer 626 may include silicon nitride, silicon oxynitride, or a combination thereof.

The mold layer 628 may include an oxide layer. In an implementation, the mold layer 628 may include at least one supporting layer. At least one supporting layer may include a material having an etching selectivity with respect to the mold layer 628.

Figure 19C:
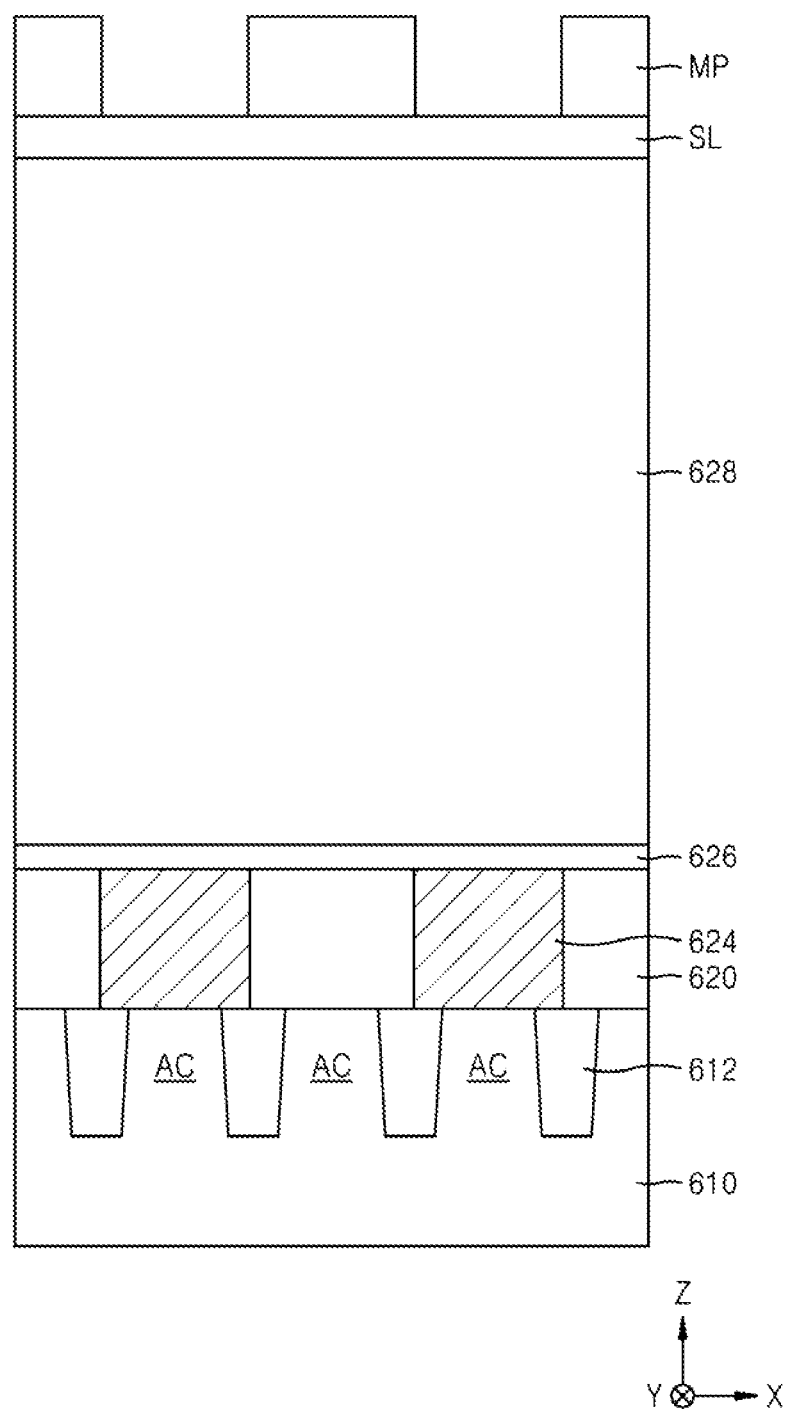

Referring to FIG. 19C, a sacrificial layer SL and a mask pattern MP may be sequentially formed on the mold layer 628. The sacrificial layer SL may include an oxide layer. The mask pattern MP may include an oxide layer, a nitride layer, a poly-silicon layer, a photoresist layer, or a combination thereof. A region in which a lower electrode layer of a capacitor is to be formed may be defined by the mask pattern MP.

Figure 19D:
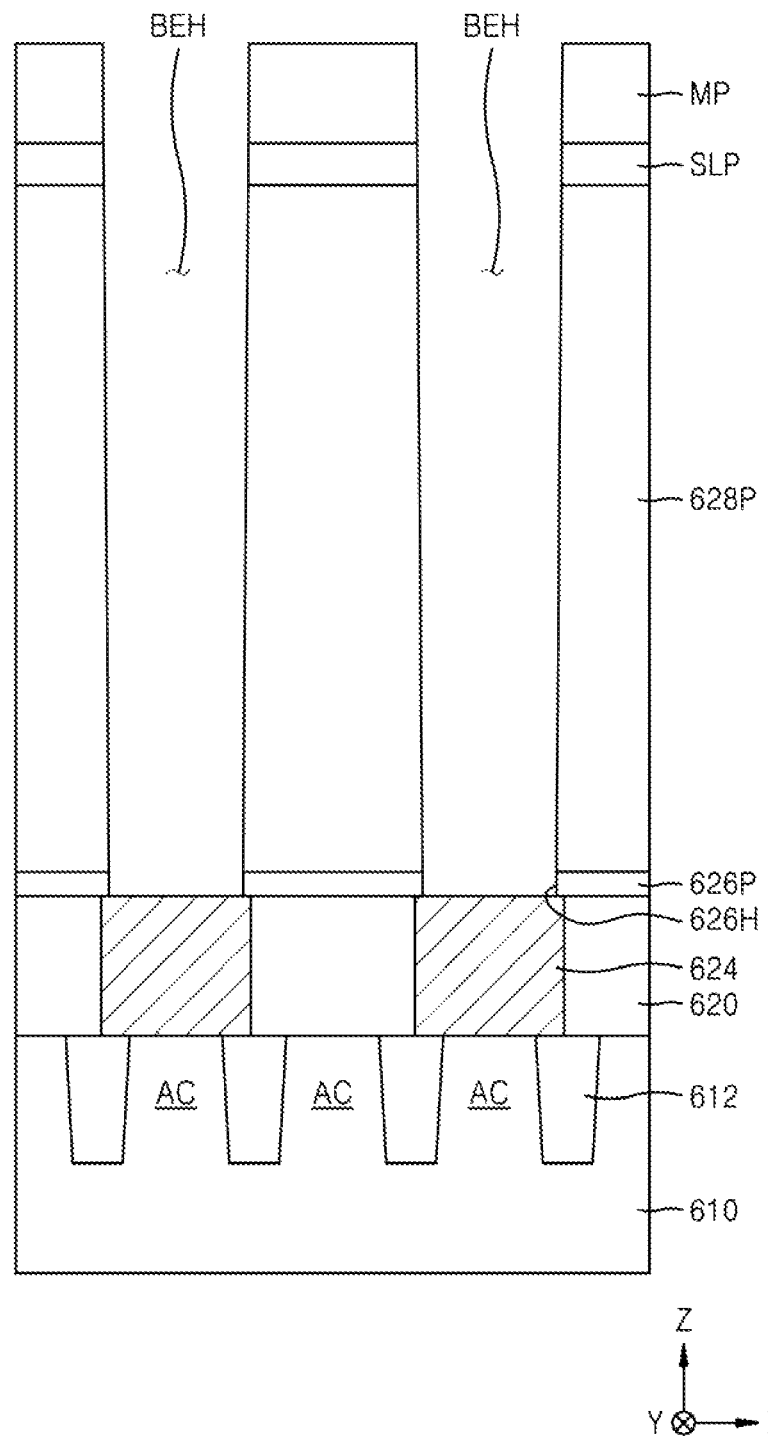

Referring to FIG. 19D, from the result of FIG. 19C, a sacrificial pattern SLP, a mold pattern 628P, and the insulation pattern 626P may be formed by anisotropically etching the sacrificial layer SL, the mold layer 628, and the insulation layer 626 using the mask pattern MP as an etching mask and the insulation layer 626 as an etch stop layer. A plurality of openings 626H exposing the conductive regions 624 may be formed in the insulation pattern 626P.

Figure 19E:
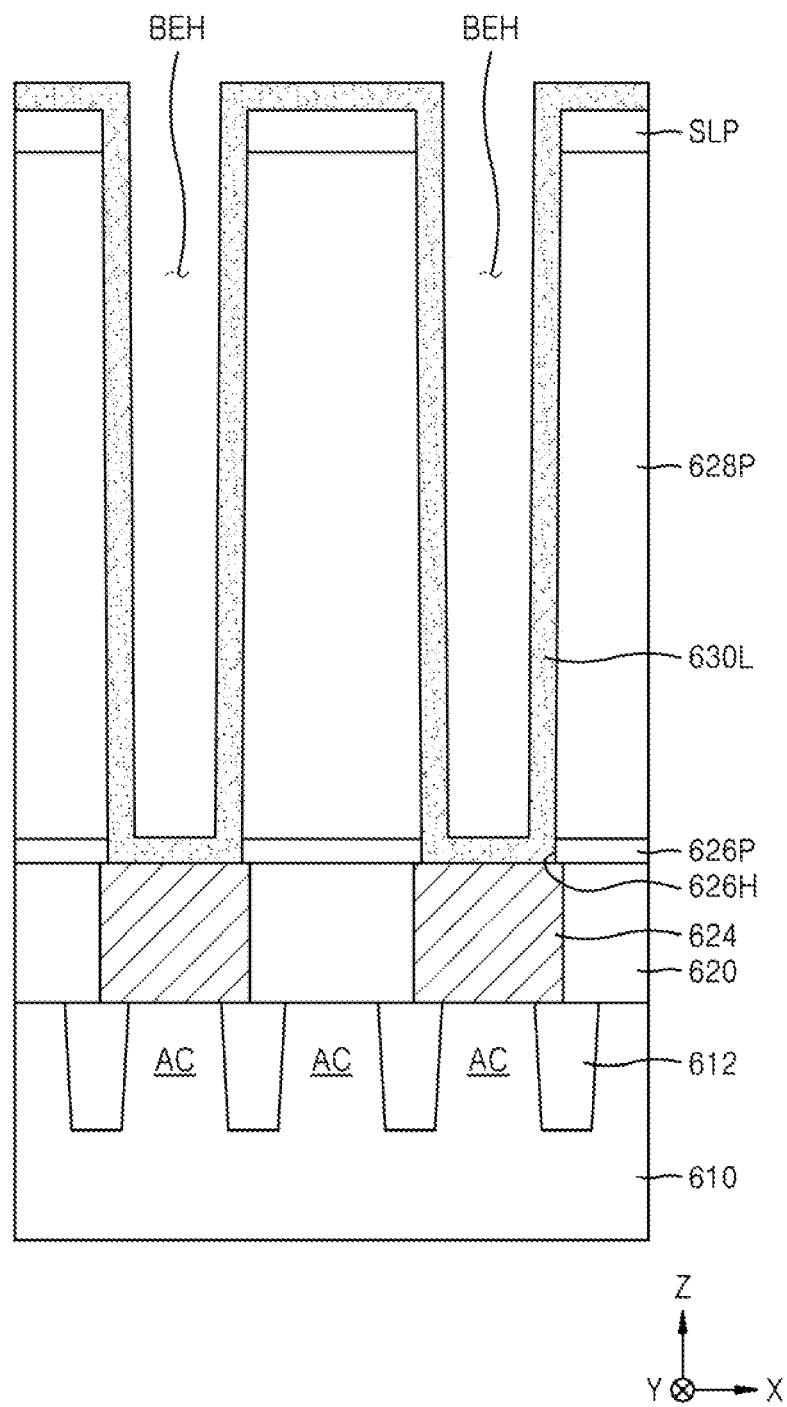

Referring to FIG. 19E, after removing the mask pattern MP from the result of FIG. 19D, a conductive layer 630L covering surfaces of the conductive regions 624, the surface of the insulation pattern 626P, the surface of the mold pattern 628P, and the surface of the sacrificial pattern SLP may be formed inside a plurality of holes BEH, respectively. The conductive layer 630L may be a lower electrode layer after a subsequent process. The conductive layer 630L may be formed to conformally cover the inner sidewalls of the holes BEH, such that the inner space of each of the holes BEH partially remains.

A material of the conductive layer 630L may be the same as the material of the first electrode layer 130 described with reference to FIG. 1. To form the conductive layer 630L, a CVD process, an MOCVD process, or an ALD process may be used.

Figure 19F:
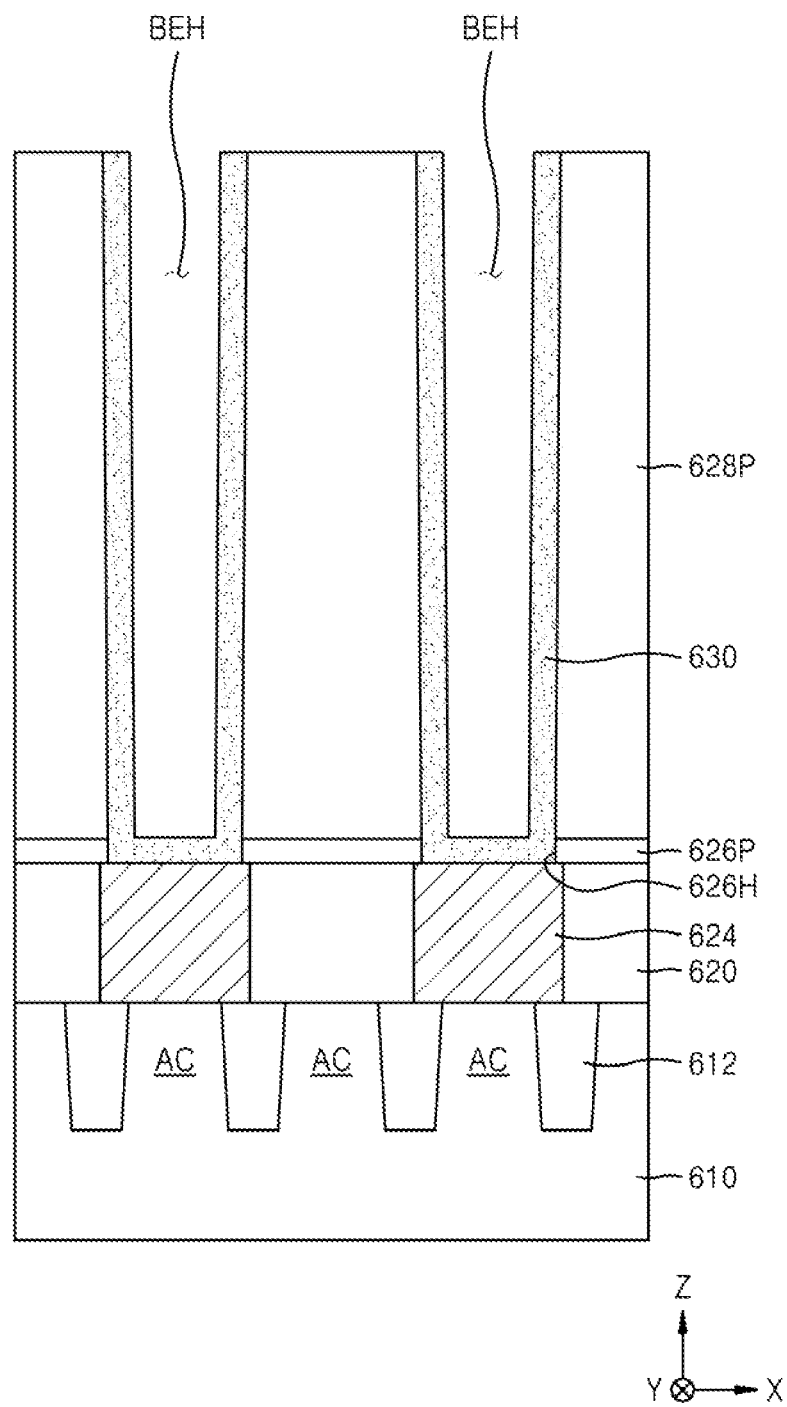

Referring to FIG. 19F, the conductive layer 630L may be separated into the lower electrode layers 630 by partially removing the upper portion of the conductive layer 630L from the result of FIG. 19E. In order to form the lower electrode layers 630, a portion of the conductive layer 630L and a sacrificial pattern (SLP of FIG. 19E) may be removed through an etch back process or a chemical mechanical polishing (CMP) process so that the top surface of the mold pattern 628P is exposed.

Figure 19G:
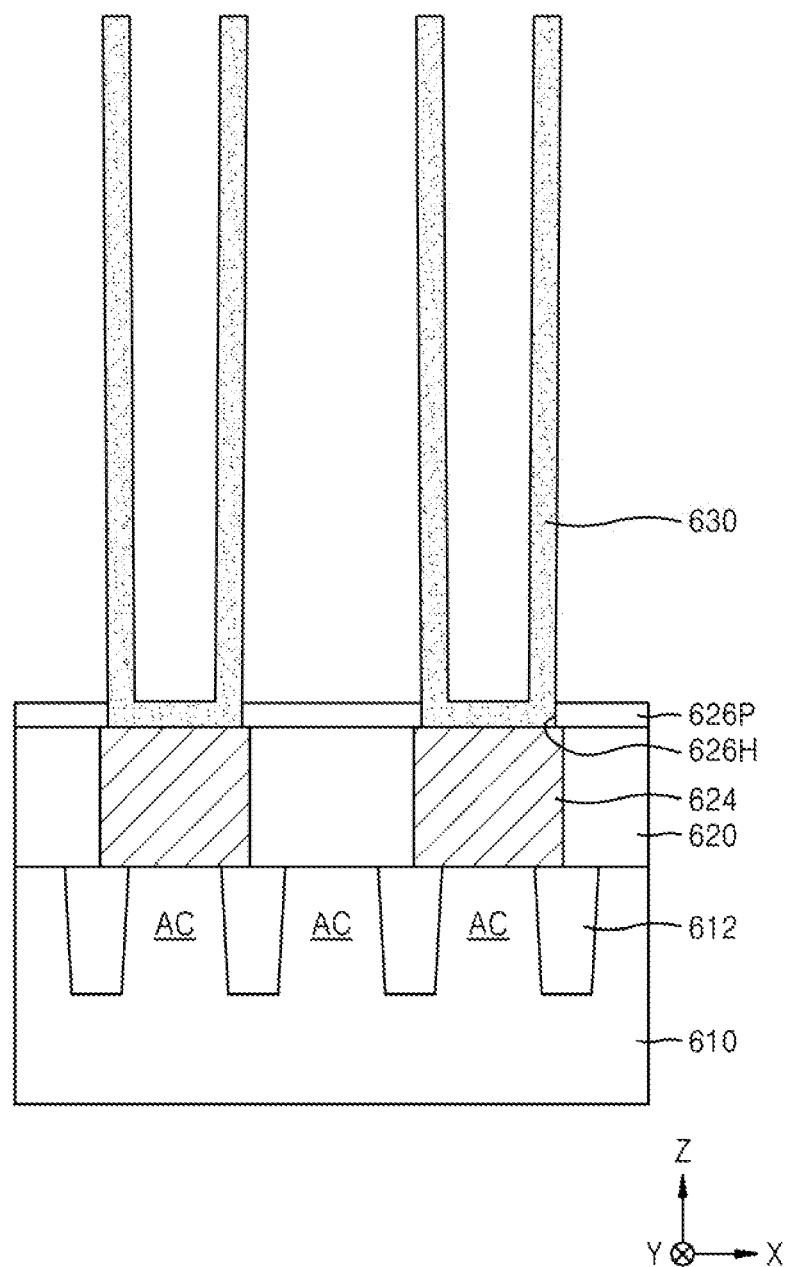

Referring to FIG. 19G, the mold pattern 628P may be removed from the result of FIG. 19F, and the outer surfaces of the lower electrode layers 630 having a cylindrical shape and the top surface of the insulation pattern 626P are exposed.

Figure 19H:
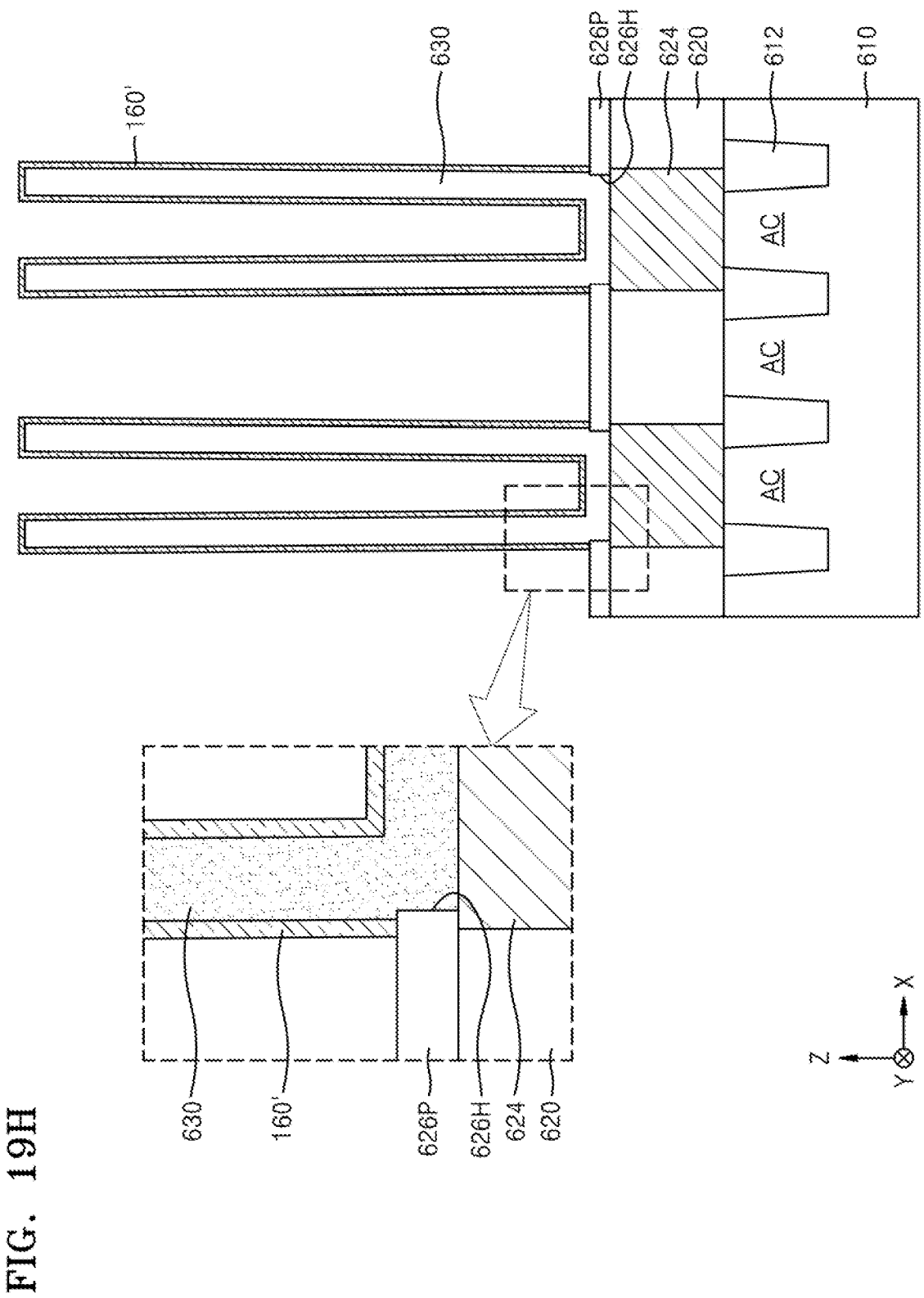

Referring to FIG. 19H, a stress buffer material layer 160' may be formed on a surface of each of the lower electrode layers 630 by oxidizing the exposed surface of each of the lower electrode layers 630. The stress buffer material layer 160' may be an amorphous metal oxide layer. The stress buffer material layer 160' may be the amorphous first metal oxide 132 of FIG. 7.

In an implementation, the stress buffer material layer 160' may be formed by performing a heat treatment on the lower electrode layers 630 at a temperature from about 100° C. to about 600° C. under an oxidizing atmosphere. The heat treatment may be, e.g., a rapid thermal annealing (RTA) process, an annealing process, a plasma annealing process, or a combination thereof.

In an implementation, the stress buffer material layer 160' may be formed by supplying an oxidizing reaction gas to the exposed surfaces of the lower electrode layers 630. The oxidizing reaction gas may include, e.g., $O_2$, $O_3$, $H_2O$, NO, $NO_2$, $N_2O$, $CO_2$, $H_2O_2$, HCOOH, $CH_3COOH$, plasma $O_2$, remote plasma $O_2$, plasma $N_2O$, plasma $H_2O$, or a combination thereof.

Figure 19I:
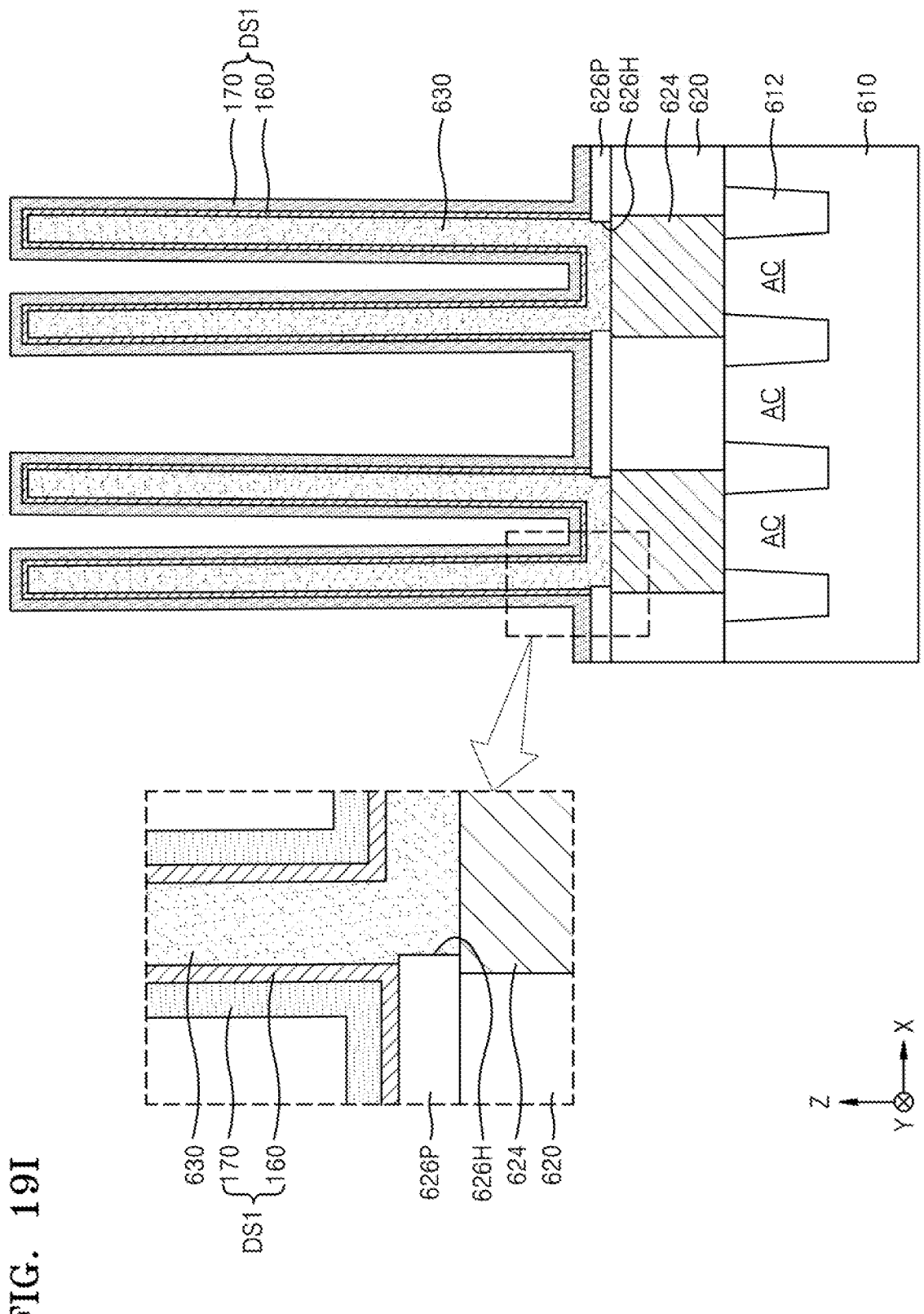

Referring to FIG. 19I, the dielectric layer 170 may be sequentially formed on the result of FIG. 19H on which the stress buffer material layer 160' has been formed. In an implementation, an ALD process may be used to form the dielectric layer 170. After the dielectric layer 170 is formed, a result structure with the dielectric layer 170 may be annealed.

During a process of forming the dielectric layer 170 or a process of annealing the dielectric layer 170, the stress buffer material layer 160' may be crystallized to form the first stress buffer layer 160. The dielectric structure DS1 including the first stress buffer layer 160 and the dielectric layer 170 may be formed.

As described above, the first stress buffer layer 160 may be formed as the stress buffer material layer 160' is crystallized by thermal stress of the lower electrode layer 630 and thermal stress of the dielectric layer 170. The process of forming the first stress buffer layer 160 is as described above with reference to FIGS. 8A, 8B, and 9. Subsequently, an upper electrode layer (640 of FIGS. 15A and 15B) may be formed on a result structure on which the dielectric structure DS1 is formed, thereby completing the manufacture of the integrated circuit device (500 of FIGS. 15A and 15B).

By way of summation and review, in an integrated circuit device, if the characteristics of a dielectric layer were poor, a leakage current could occur or desired electrical characteristics may not be obtained. Moreover, a thickness of a dielectric layer may be decreased as an integrated circuit device becomes highly integrated, and a structure may be capable of improving the characteristics of the dielectric layer.

One or more embodiments may provide an integrated circuit device including a dielectric layer.

One or more embodiments may provide an integrated circuit device capable of improving the characteristics of a dielectric layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An integrated circuit device, comprising:
a first electrode layer including a first metal and having a first thermal expansion coefficient;
a dielectric layer on the first electrode layer, the dielectric layer including a second metal oxide including a second metal that is different from the first metal, and having a second thermal expansion coefficient that is less than the first thermal expansion coefficient;
a first stress buffer layer between the first electrode layer and the dielectric layer, the first stress buffer layer:
including a first metal oxide including the first metal, directly contacting the dielectric layer, and
being formed due to thermal stress of the first electrode layer and thermal stress of the dielectric layer; and
a second stress buffer layer between the first electrode layer and the first stress buffer layer, the second stress buffer layer including a third metal oxide including a third metal that is different from the second metal.

2. The integrated circuit device as claimed in claim 1, wherein the first stress buffer layer has a rutile-shaped tetragonal crystal structure.

3. The integrated circuit device as claimed in claim 1, wherein the first stress buffer layer includes an interface layer at an interface between the first electrode layer and the dielectric layer.

4. The integrated circuit device as claimed in claim 1, wherein the dielectric layer and the first stress buffer layer include a crystalline layer.

5. The integrated circuit device as claimed in claim 1, wherein a thickness of the first stress buffer layer is less than a thickness of the dielectric layer.

6. The integrated circuit device as claimed in claim 1, wherein a difference between the first thermal expansion coefficient and the second thermal expansion coefficient is about $3.0 \times 10^{-6}$/K to about $8.0 \times 10^{-6}$/K.

7. The integrated circuit device as claimed in claim 1, wherein lattice mismatch between the first metal oxide constituting the first stress buffer layer and the second metal oxide constituting the dielectric layer is 7% or less.

8. The integrated circuit device as claimed in claim 1, wherein the dielectric layer has a tetragonal crystal structure.

9. The integrated circuit device as claimed in claim 1, wherein the first metal includes a transition metal or a post-transition metal.

10. The integrated circuit device as claimed in claim 1, wherein the first electrode layer includes a metal film including the first metal, a metal nitride film including the first metal, or a combination thereof.

11. The integrated circuit device as claimed in claim 1, wherein:
the first metal oxide includes titanium oxide, chromium oxide, niobium oxide, ruthenium oxide, or nickel oxide, and
the second metal oxide includes hafnium oxide or zirconium oxide.

12. An integrated circuit device, comprising:
a first electrode layer including a first metal and having a first thermal expansion coefficient;
a dielectric layer on the first electrode layer, the dielectric layer including a second metal oxide including a second metal that is different from the first metal, and having a second thermal expansion coefficient that is less than the first thermal expansion coefficient;
a first stress buffer layer between the first electrode layer and the dielectric layer, the first stress buffer layer:
including a first metal oxide including the first metal, and
being formed due to thermal stress of the first electrode layer and thermal stress of the dielectric layer; and
a second stress buffer layer between the first electrode layer and the first stress buffer layer, the second stress buffer layer including a third metal oxide including a third metal that is different from the second metal.

13. The integrated circuit device as claimed in claim 12, wherein the first stress buffer layer has a rutile-shaped tetragonal crystal structure.

14. The integrated circuit device as claimed in claim 13, wherein:
the second stress buffer layer is formed by thermal stress of the first electrode layer and thermal stress of the dielectric layer, and
the second stress buffer layer has a rutile-shaped tetragonal crystal structure that is the same as that of the first stress buffer layer.

15. The integrated circuit device as claimed in claim 12, wherein:
the second stress buffer layer includes an interface layer at an interface between the first electrode layer and the first stress buffer layer, and
the dielectric layer, the first stress buffer layer, and the second stress buffer layer include crystalline layers.

16. The integrated circuit device as claimed in claim 12, wherein the first metal and the third metal each independently include a transition metal or a post-transition metal.

17. An integrated circuit device, comprising:
a lower electrode layer including a first metal and having a first thermal expansion coefficient;
an upper electrode layer above the lower electrode layer and facing the lower electrode layer; and
a dielectric structure between the lower electrode layer and the upper electrode layer,
wherein the dielectric structure includes:
a dielectric layer on the lower electrode layer, the dielectric layer including a second metal oxide including a second metal that is different from the first metal, and having a second thermal expansion coefficient that is less than the first thermal expansion coefficient;
a first stress buffer layer between the lower electrode layer and the dielectric layer, the first stress buffer layer:
including a first metal oxide including the first metal, and being formed due to thermal stress of the lower electrode layer and thermal stress of the dielectric layer; and
a second stress buffer layer between the lower electrode layer and the first stress buffer layer, the second stress buffer layer including a third metal oxide including a third metal that is different from the second metal.

18. The integrated circuit device as claimed in claim 17, wherein the first stress buffer layer has a rutile-shaped tetragonal crystal structure.

19. The integrated circuit device as claimed in claim 17, wherein:
the lower electrode layer includes the same material as the upper electrode layer, and
the first metal oxide includes titanium oxide, ruthenium oxide, chromium oxide, or nickel oxide, and the second metal oxide includes hafnium oxide, or zirconium oxide.

* * * * *